US009111623B1

(12) United States Patent
Jung et al.

(10) Patent No.: US 9,111,623 B1
(45) Date of Patent: Aug. 18, 2015

(54) NMOS-OFFSET CANCELING CURRENT-LATCHED SENSE AMPLIFIER

(71) Applicants:QUALCOMM INCORPORATED, San Diego, CA (US); Industry-Academic Cooperation Foundation, Yonsei University, Seoul (KR)

(72) Inventors: Seong-Ook Jung, Seoul (KR); Taehui Na, Seoul (KR); Ji-su Kim, Seoul (KR); Jung Pill Kim, San Diego, CA (US); Seung Hyuk Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/179,115

(22) Filed: Feb. 12, 2014

(51) Int. Cl.
  *G11C 11/16* (2006.01)
(52) U.S. Cl.
  CPC .................................. *G11C 11/1673* (2013.01)
(58) Field of Classification Search
  CPC .............................. G11C 11/16; G11C 11/161
  USPC .................................................. 365/158, 173
  See application file for complete search history.

(56) References Cited

U.S. PATENT DOCUMENTS

| 5,381,053 | A | | 1/1995 | Yasuda | |
|---|---|---|---|---|---|
| 5,614,853 | A | | 3/1997 | Van Rens | |
| 5,969,557 | A | * | 10/1999 | Tanzawa et al. | 327/291 |
| 6,028,455 | A | * | 2/2000 | Yamauchi | 327/52 |
| 6,046,612 | A | * | 4/2000 | Taft | 327/77 |
| 6,181,621 | B1 | | 1/2001 | Lovett | |
| 6,396,733 | B1 | * | 5/2002 | Lu et al. | 365/158 |
| 6,597,600 | B2 | * | 7/2003 | Baker | 365/158 |
| 7,202,726 | B2 | * | 4/2007 | Kunanayagam et al. | 327/274 |
| 7,545,693 | B2 | | 6/2009 | Toda | |
| 7,724,564 | B2 | * | 5/2010 | Taylor et al. | 365/148 |
| 7,920,009 | B2 | | 4/2011 | Kosic et al. | |
| 8,014,218 | B2 | | 9/2011 | Barth, Jr. | |
| 8,203,899 | B2 | * | 6/2012 | Chen et al. | 365/207 |
| 8,423,814 | B2 | * | 4/2013 | Loinaz | 713/500 |
| 8,619,484 | B2 | * | 12/2013 | Lim et al. | 365/207 |
| 8,791,749 | B2 | * | 7/2014 | Nakamura et al. | 327/536 |
| 8,890,785 | B2 | * | 11/2014 | Lin et al. | 345/94 |
| 8,982,652 | B2 | * | 3/2015 | Kajigaya et al. | 365/207 |
| 2011/0227639 | A1 | | 9/2011 | Phan et al. | |
| 2013/0155761 | A1 | | 6/2013 | Aoki | |
| 2014/0003124 | A1 | | 1/2014 | Yongsik YOUN et al. | |

OTHER PUBLICATIONS

International Search Report and Written Opinion - PCT/US2015/014502 - Isa/Epo - 2015-04-29 (134886W0).

* cited by examiner

*Primary Examiner* — Michael Tran
(74) *Attorney, Agent, or Firm* — Seyfarth Shaw LLP

(57) ABSTRACT

A resistive memory sensing method includes sensing outputs of an offset-cancelling dual stage sensing circuit (OCDS-SC) by an NMOS offset-cancelling current latched sense amplifier circuit (NOC-CLSA). The NOC-CLSA is configured with a reduced input capacitance and a reduced offset voltage. Input transistors of the NOC-CLSA are coupled between latch circuitry and ground. A first phase output of the OCDS-SC is stored by the NOC-CLSA during a pre-charge step of the NOC-CLSA operation. A second phase output of the OCDS-SC is stored by the NOC-CLSA during an offset-cancelling step of the NOC-CLSA operation. By pipelining the OCDS-SC and NOC-CLSA, a sensing delay penalty of the OCDS-SC is overcome.

20 Claims, 22 Drawing Sheets

NMOS-OFFSET CANCELING CURRENT-LATCHED SENSE AMPLIFIER

TECHNICAL FIELD

The present disclosure generally relates to magnetic random access memory (MRAM). More specifically, the present disclosure relates to sensing circuitry for spin torque transfer magnetic random access memory (STT-MRAM) cells.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

MRAM is an inherently scalable type of memory because the MTJ critical switching current ($I_c$) scales linearly with device area. However, as the critical switching current for writing to an MTJ decreases, the sensing current used to measure the resistance of the MTJ for reading its logical state (magnetization orientation) also decreases to prevent a read disturbance. For example, due to process variations the sensing current used to measure the resistance of an MTJ could exceed the critical switching current and change the logical state of the MTJ being read. Thus, increased scaling of MRAM leads to a reduced sensing margin. The reduction of sensing current may also causes reduced switching speed of the MTJ.

The critical switching current of an MTJ increases sharply when the pulse width of the switching current is decreased. Thus, one technique for preventing read disturbance in MRAM involves the application of an MTJ sensing current with a shortened pulse width. For example a sensing current having a pulse width of less than about 10 nanoseconds may be used for measuring the resistance of an MTJ. The sensing current pulse width may be reduced to a lower limit of about 3 nanoseconds with reliable sensing. With technology scaling, however, the switching current of an MTJ will continue to decrease. Thus, as the sensing current pulse width approaches its lower limit with increased MTJ scaling, sense current should still be reduced to prevent read disturbance.

BRIEF SUMMARY

In one aspect of the present disclosure, a sensing method in a sense amplifier circuit method includes pre-charging a gate of a first input transistor and a gate of a second input transistor to a first fixed voltage node. The first input transistor may be coupled between a first latch transistor of a latch circuit and a second fixed voltage node. In addition, the second input transistor may be coupled between a second latch transistor of the latch circuit and the second fixed voltage node. The method also includes discharging the gate of the first input transistor and the gate of the second input transistor, capturing a data voltage at the gate of the first input transistor, and capturing a reference voltage at the gate of the second input transistor. The method further includes coupling a first output node of the latch circuit to the first fixed voltage node and coupling a second output node of the latch circuit to the second fixed voltage node when the data voltage is greater than the reference voltage. The method also includes coupling the first output node of the latch circuit to the second fixed voltage node and coupling the second output node to the first fixed voltage node when the reference voltage is greater than the data voltage.

A resistive memory sensing apparatus, according to another aspect of the present disclosure, includes a first switched input capacitor coupled between an output of a resistive memory sensing circuit and a first fixed voltage node. The resistive memory apparatus also includes a second switched input capacitor coupled between the output of the resistive memory sensing circuit and the first fixed voltage node, and a latch circuit selectively coupled between a second fixed voltage node and the first fixed voltage node. The resistive memory sensing apparatus further includes a first input transistor coupled between the latch circuit and the first fixed voltage node, and a second input transistor coupled between the latch circuit and the first fixed voltage node. The first input transistor includes a gate coupled to the first switched input capacitor. The second input transistor includes a gate coupled to the second switched input capacitor.

A sensing apparatus, according to another aspect of the present disclosure, includes means for pre-charging a gate of a first input transistor and a gate of a second input transistor to a first fixed voltage node. The first input transistor may be coupled between a first latch transistor of a latch circuit and a second fixed voltage node, and the second input transistor may be coupled between a second latch transistor of the latch circuit and the second fixed voltage node. The sensing apparatus also includes means for discharging the gate of the first input transistor and the gate of the second input transistor, means for capturing a data voltage at the gate of the first input transistor, and means for capturing a reference voltage at the gate of the second input transistor. The sensing apparatus further includes means for coupling a first output node of the latch circuit to the first fixed voltage node and means for coupling a second output node of the latch circuit to the second fixed voltage node when the data voltage is greater than the reference voltage. The sensing apparatus also includes means for coupling the first output node of the latch circuit to the second fixed voltage node and means for coupling the second output node to the first fixed voltage node when the reference voltage is greater than the data voltage.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DESCRIPTION OF THE DRAWINGS

For a more complete understanding of the present disclosure, reference is now made to the following description taken in conjunction with the accompanying drawings.

DETAILED DESCRIPTION

Figure 1:
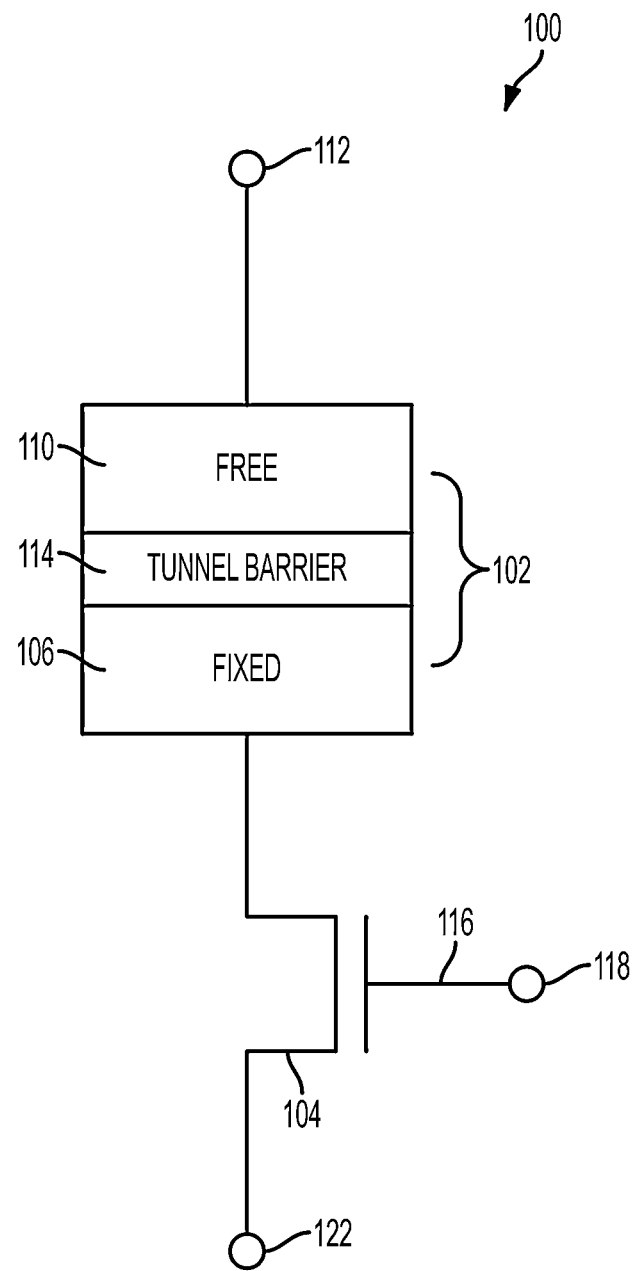
FIG. 1 is a diagram of a resistive memory element.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Magnetic random access memory (MRAM) (e.g., spin-transfer-torque MRAM (STT-MRAM)), exhibits a read disturbance problem because the read operation of the MRAM uses the same current path as the write operation. A sensing current of the MRAM may be lowered to reduce the read disturbance problem. Because the sensing margin generally decreases with the lowered sensing current, however, lowering of the sensing current is limited. Thus, a large sensing margin may be specified to lower the sensing current. A large sensing margin can be achieved by using an offset-canceling dual stage (OCDS) sensing circuit, which also lowers the sensing current. Even though the offset of the sensing circuit is canceled out, the sensing margin can be limited due to the limited sensing time and offset voltage of the sense amplifier (VSA_OS). In addition, a voltage difference should be larger than the sense amplifier offset voltage for a given sensing time.

One aspect of the present disclosure significantly lowers a sense amplifier offset voltage by canceling any effect on the sense amplifier that is caused by a process variation. Lowering of the sense amplifier offset voltage results in a significant improvement of the sensing margin and the sensing speed of the sense amplifier. According to an aspect of the present disclosure, an NMOS offset-cancelling current latched sense amplifier (NOC-CLSA) is described. This NMOS offset-cancelling current latched sense amplifier overcomes many of the drawbacks of existing NMOS offset canceling voltage latched sense amplifiers (NOC-VLSA) and is suitable for use with an offset-canceling dual stage sensing circuit (OCDS-SC).

Conventional NMOS offset canceling voltage latched sense amplifiers suffer from several problems including a large input capacitance (Cin) and an output capacitance mismatch. In addition, the sense amplifier offset voltage is a function of not only a threshold voltage mismatch but also an output capacitance mismatch. In these conventional NMOS offset canceling voltage latched sense amplifiers, a large number of additional components are connected to the output nodes. This may cause a significant output capacitance mismatch as well as latch PMOS sensitivity. These conventional NMOS offset canceling voltage latched sense amplifiers can cancel the threshold voltage mismatch caused by a latch NMOS. The sense amplifier offset voltage, however, is affected by both the latch NMOS and the latch PMOS. For these reasons, sense amplifier offset voltage is limited in the conventional NMOS offset canceling voltage latched sense amplifiers. One aspect of the present disclosure mitigates the above problems and, thus, a reduced sense amplifier offset voltage is provided.

Unlike a conventional NMOS offset canceling voltage latched sense amplifier, which includes about thirteen junction capacitances and two gate capacitances, an NMOS offset-cancelling current latched sense amplifier according to aspects of the present disclosure may include five junction capacitances and one gate capacitance. Thus, the input capacitance (Cin) of the an NMOS offset-cancelling current latched sense amplifier, according to aspects of the present disclosure, is less than the input capacitance of a conventional NMOS offset canceling voltage latched sense amplifier. Due to the reduced charge sharing loss, the data voltage (VSA_data) and the reference voltage (VSA_REF) can be more efficiently transferred to the gate of the input NMOS transistors. Furthermore, the NMOS offset-cancelling current latched sense amplifier, according to aspects of the present disclosure, enables the use of smaller isolated capacitors (CSC), which reduces the sensing delay of an offset-cancelling dual stage sensing circuit.

The structure of an NMOS offset-cancelling current latched sense amplifier, according to aspects of the present disclosure, includes portions of a conventional foot-switched current latched sense amplifier (FS-CLSA). Although a conventional foot-switched current latched sense amplifier exhibits a dead zone below a threshold voltage plus some predetermined margin, the dead zone of the NMOS offset-cancelling current latched sense amplifier, according to aspects of the present disclosure, is substantially reduced. During the offset-cancelling phase of operation, the minimum gate voltage of the input NMOS transistors becomes the threshold voltage. Therefore, the sensing dead zone of the NMOS offset-cancelling current latched sense amplifier, according to aspects of the present disclosure, exists only below the predetermined margin.

The NMOS offset-cancelling current latched sense amplifier, according to one aspect of the present disclosure, includes fewer components coupled to an output node than are coupled to the output node of a conventional NMOS offset canceling voltage latched sense amplifier. Thus, the NMOS offset-cancelling current latched sense amplifier according to aspects of the present disclosure has much smaller output capacitance mismatch than a conventional voltage latched sense amplifier. In the conventional voltage latched sense amplifier, a large output capacitance and a mismatch in the latch PMOS transistors limits the offset variation (σSA_OS). By comparison, the offset variation of the current latched sense amplifier, according to aspects of the present disclosure, is predominantly determined by the input NMOS transistors. In addition, the offset caused by the input NMOS transistors is canceled out with a small output capacitance mismatch. Therefore, offset variation of the current latched sense amplifier is reduced.

FIG. 1 illustrates a resistive memory element 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be an anti-ferromagnetic material such as CoFeB, and the tunnel barrier layer 114 may be MgO, for example.

Figure 2:
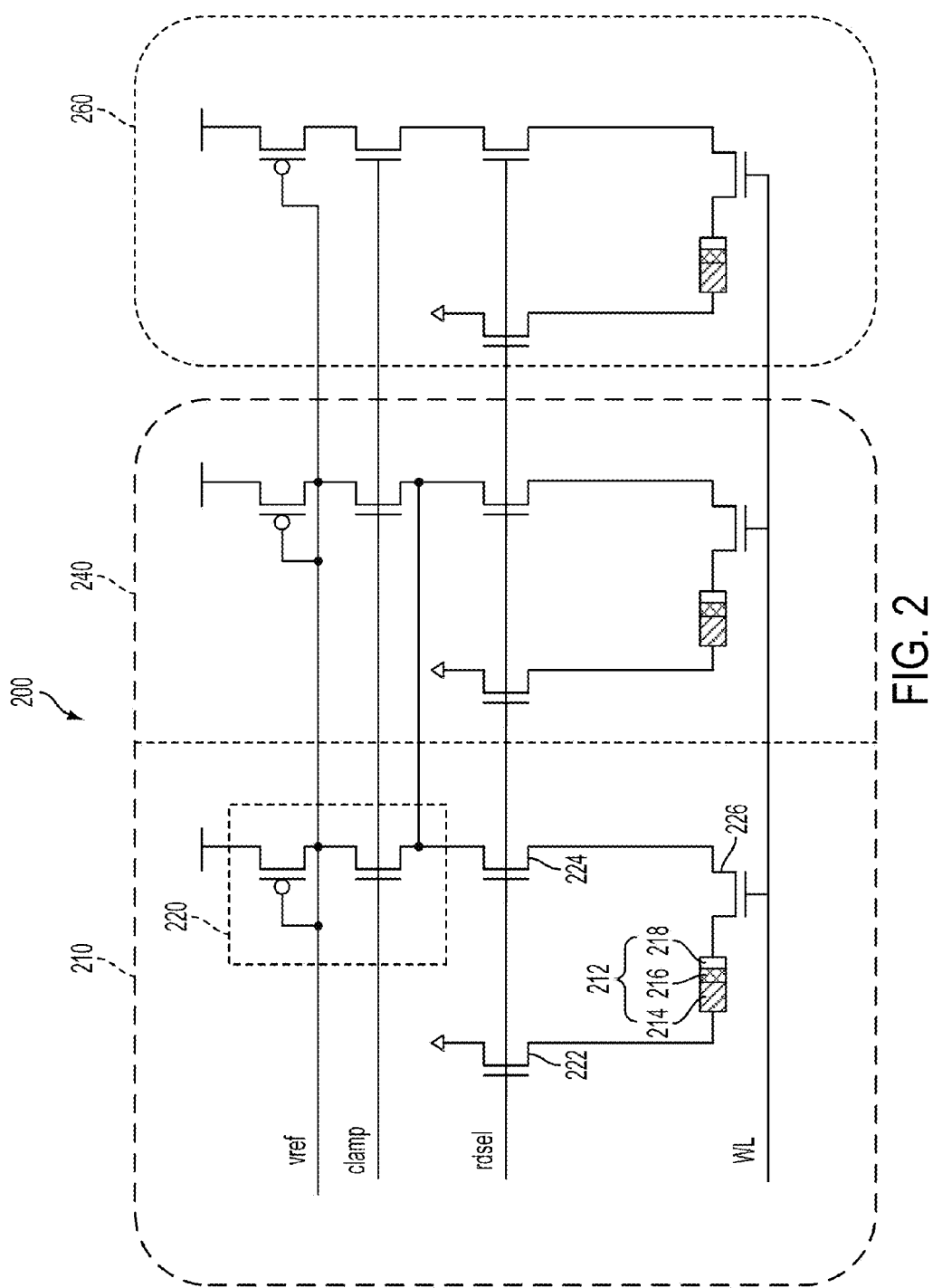
FIG. 2 is a diagram of a resistive memory device and circuitry for programming and reading the resistive device.

FIG. 2 is a circuit schematic illustrating a portion of a conventional magnetic random access memory (MRAM) 200. An MRAM 200 is divided into a data circuit 260, and reference circuits 240, 210, the data circuit 260 and the reference circuits 210, 240, including bitcells 212 (only a single bitcell is illustrated to facilitate understanding). During read out of the bitcell 212 of the data circuit 260, the resistance of the magnetic tunnel junction is compared to the effective resistance of two reference MTJs connected in parallel, where one is the reference parallel MTJ of the reference circuit 210 and the other is the reference anti-parallel MTJ of the reference circuit 240. Resistance of the bitcells 212 is measured by applying a source voltage and determining an amount of current flowing through the bitcells 212. For example, in the bitcell of the reference circuit 210 (e.g., parallel), a current source 220 is applied to a magnetic tunnel junction (MTJ) 212 by read select transistors 222, 224, and a word line select transistor 226. Within each bitcell 212, an MTJ includes a fixed layer 214, tunneling layer 216, and a free layer 218. When the free layer 218 and the fixed layer 214 have magnetizations aligned substantially parallel, the resistance of the MTJ, and thus the bitcell 212, is low. When the free layer 218 and the fixed layer 214 have magnetizations aligned substantially anti-parallel, the resistance of the MTJ, and thus the bitcell 212, is high.

Bitcells of a magnetic random access memory (MRAM) may be arranged in one or more arrays including a pattern of memory elements (e.g., MTJ in case of MRAM). Spin-transfer-torque magnetic random access memory (STT-MRAM) is an emerging nonvolatile memory and its advantages of non-volatility, comparable speed to dynamic random access memory (DRAM), smaller chip size compared to static random access memory (SRAM), unlimited read/write endurance, and low array leakage current have opened a great opportunity to spin-transfer-torque magnetic random access memory (STT-MRAM) as a universal working memory in system on chip (SoC) design.

Figure 3A:
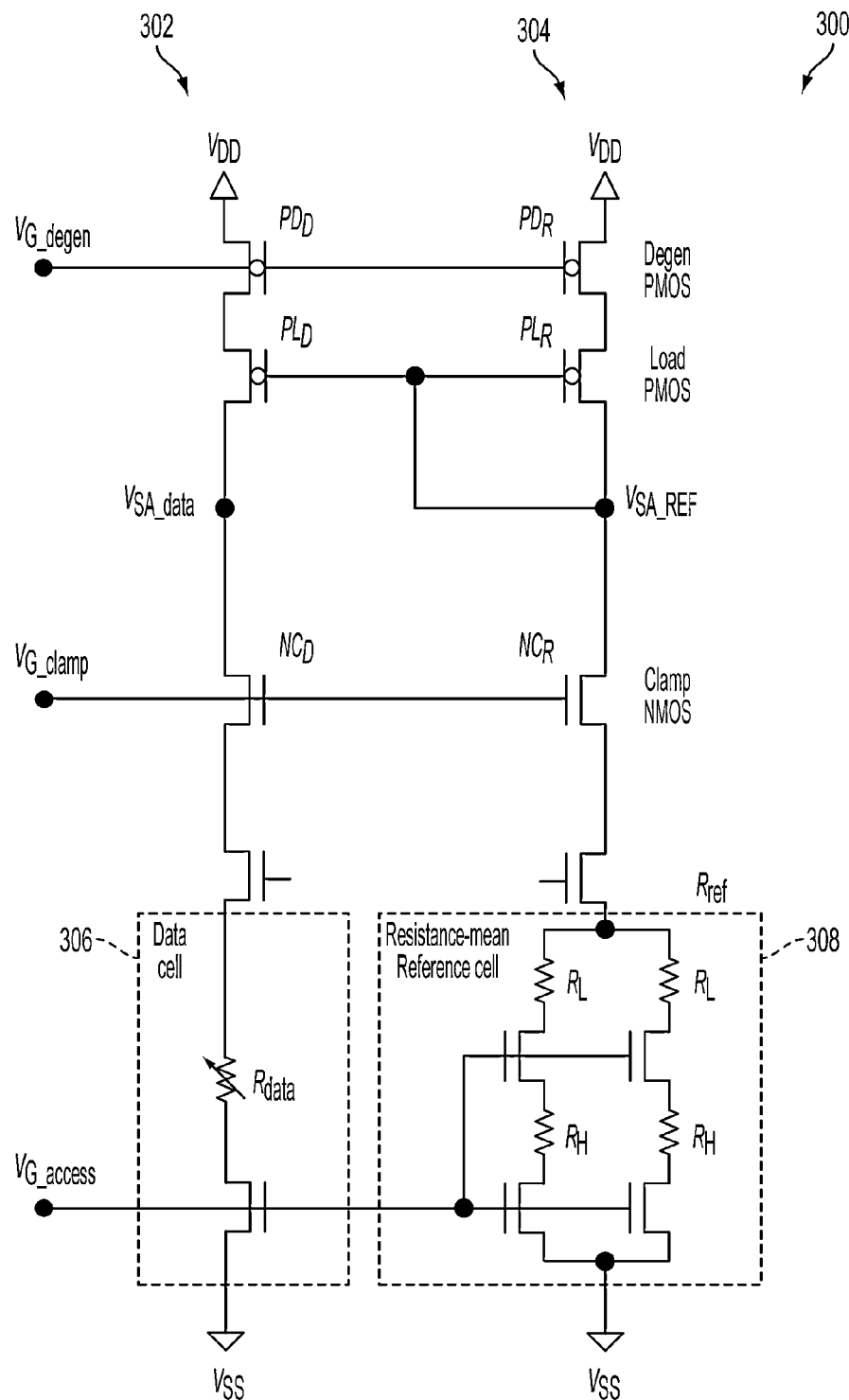
FIG. 3A is a diagram of a conventional resistive memory sensing circuit.

The effect of process variation on an MRAM sensing circuit is described with reference to FIGS. 3A-3B. FIG. 3A is a circuit schematic diagram illustrating a sensing circuit 300 in a portion of a conventional magnetic random access memory (MRAM). The sensing circuit 300 includes a data current path 302 and a reference current path 304. The data current path 302 includes a data path degeneration PMOS ($PD_D$), a data path load PMOS ($PL_D$) and a data path clamp NMOS ($NC_D$) coupled to a data cell 306. A data path sensing circuit output node ($V_{SA\_data}$) is located between the data path load PMOS ($PL_D$) and the data path clamp NMOS ($NC_D$). The reference current path 304 includes a reference path degeneration PMOS ($PD_R$), a reference path load PMOS ($PL_R$) and a reference path clamp NMOS ($NC_R$) coupled to a reference cell 308. A reference path sensing circuit output node ($V_{SA\_REF}$) is located between the reference path load PMOS ($PL_R$) and the reference path clamp NMOS ($NC_R$). The reference path sensing circuit output node ($V_{SA\_REF}$) is coupled to the gate of the data path load PMOS ($PL_D$) and the gate of the reference path load PMOS ($PL_R$).

Figure 3B:
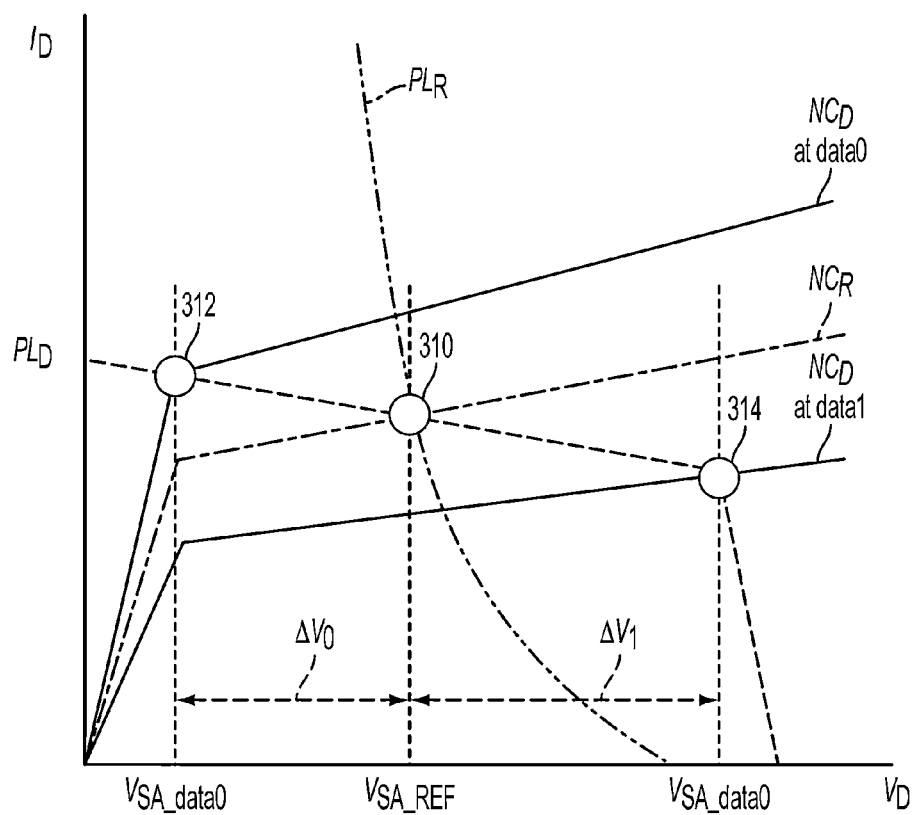
FIG. 3B is a graph showing voltage-current relationships of the conventional resistive memory sensing circuit shown in FIG. 3A.

FIG. 3B illustrates the current-voltage (I-V) curves of the data path clamp NMOS ($NC_D$), the reference path clamp NMOS ($NC_R$), and the reference path load PMOS. The I-V curve of the data path clamp NMOS ($NC_D$) is shown for a data zero state of the data cell 306 and for data one state of the data cell 306. The crossing point between I-V curves of a clamp NMOS and a corresponding load PMOS represents an operating point of the respective current path.

In the sensing circuit 300, the voltage at the reference path sensing circuit output node $V_{SA\_REF}$ is fixed at a reference path operating point 310. The voltage at the data path sensing circuit output node $V_{SA\_data}$ depends on the logical state of the data cell 306. When the data cell 306 is in a data zero state, the voltage at the data path sensing circuit output node $V_{SA\_data}$ is at a first data path operating point 312. When the data cell 306 is in a data one state, the voltage at the data path sensing circuit output node $V_{SA\_data}$ is at a second data path operating point 314. A large difference $\Delta V$ between the voltage at the reference path sensing circuit output node $V_{SA\_REF}$ and the voltage at the data path sensing circuit output node $V_{SA\_data}$ provides a more reliable sensing of the data in an MRAM.

Some variation of $\Delta V$ results from the process variations in fabricating the load PMOS and clamp NMOS of the sensing circuit 300. Sensing failures resulting in incorrect data readings may be caused by process variation that results in decreasing $\Delta V$. Sensing margins are expected to be further degraded due to increases in process variations as the feature sizes of MRAM devices are reduced below about 90 nm, for example.

Applicant's co-pending application, U.S. patent application Ser. No. 14/015,845 filed on Aug. 30, 2013, entitled Offset Canceling Dual Stage Sensing Circuit, the disclosure of which is expressly incorporated herein by reference in its entirety, describes an offset-cancelling dual stage sensing circuit and voltage sense amplifier that improve tolerance of fabrication process variations and reduce the read disturbance of an MTJ. The offset-cancelling dual stage sensing circuit is described with reference to the circuit diagrams in FIG. 4A-4C.

Figure 4A:
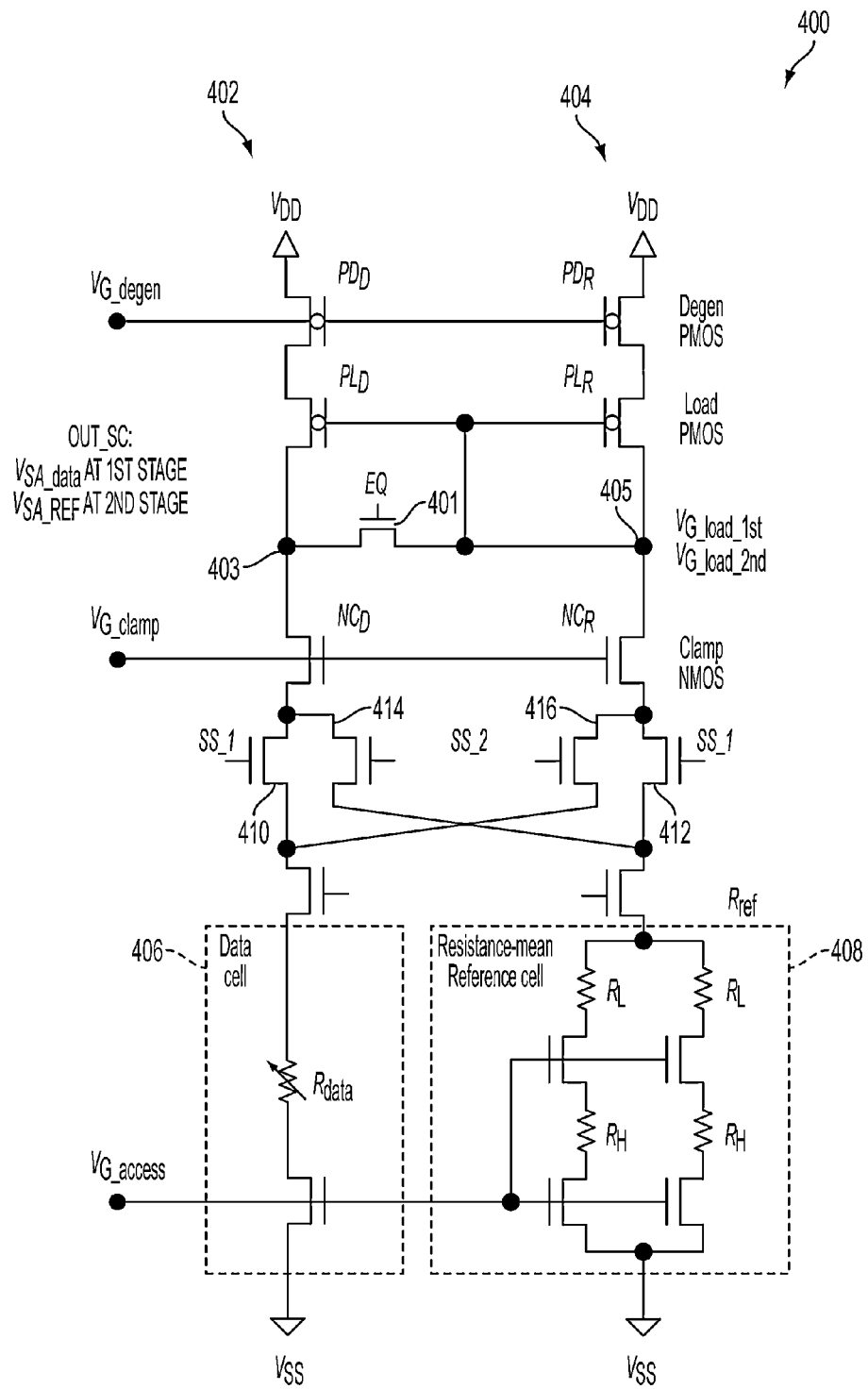
FIG. 4A is a diagram of an offset-cancelling dual stage sensing circuit according to an aspect of the present disclosure.

FIG. 4A is a circuit schematic illustrating an offset-cancelling dual stage sensing circuit 400 in a portion of a magnetic random access memory (MRAM). The offset-cancelling dual stage sensing circuit 400 includes a data current path 402 and a reference current path 404. The data current path 402 includes a data path degeneration PMOS ($PD_D$), a data path load PMOS ($PL_D$), a data path first stage switching transistor 410 and a data path clamp NMOS ($NC_D$) coupled to a data cell 406. A sensing circuit output node 403 is located between the data path load PMOS ($PL_D$) and the data path clamp NMOS ($NC_D$). The reference current path 404 includes a reference path degeneration PMOS ($PD_R$), a reference path load PMOS ($PL_R$), a reference path first stage switching transistor 412 and a reference path clamp NMOS ($NC_R$) coupled to a reference cell 408.

An adjustable load PMOS gate node 405 is located between the reference path load PMOS ($PL_R$) and the reference path clamp NMOS ($NC_R$). The adjustable load PMOS gate node 405 is coupled to the gate of the data path load PMOS ($PL_D$) and the gate of the reference path load PMOS ($PL_R$). An equalization transistor 401 is coupled between the sensing circuit output node 403 and the adjustable load PMOS gate node 405. A data path second stage switching transistor 414 is coupled between the data path clamp NMOS ($NC_D$) and the reference cell 408. A reference path second stage switching transistor 416 is coupled between the reference path clamp NMOS ($NC_R$) and the data cell 406.

In a first operating stage of the offset-cancelling dual stage sensing circuit 400, a first stage enable signal (SS_1) is on and a second stage enable signal (SS_2) is off. The first stage enable signal (SS_1) turns on the data path first stage switching transistor 410 and the reference path first stage switching transistor 412. Early in the first operating stage, an equalization signal (EQ) to the equalization transistor 401 becomes high. The data current path 402 is charged rapidly by equalizing an output ($V_{OUT\_SC}$) at the sensing circuit output node 403 and a load PMOS gate voltage ($V_{G\_load}$) at the adjustable load PMOS gate node 405. This equalization leads to an improvement in sensing speed. Later in the first operating stage, the equalization signal (EQ) becomes low, which decouples the sensing circuit output node 403 and the adjustable load PMOS gate node 405. Thus, during the first operating stage, $V_{G\_load\_1st}$ is generated based on $R_{ref}$ and $V_{SA\_data}$ is generated by using $R_{data}$ and $V_{G\_load\_1st}$.

In a second operating stage, of the offset-cancelling dual stage sensing circuit 400, the first stage enable signal (SS_1) is off and the second stage enable signal (SS_2) is on. The second stage enable signal (SS_2) turns on the data path second stage switching transistor 414 and the reference path second stage switching transistor 416. Early in the second operating stage, an equalization signal (EQ) becomes high so $V_{OUT\_SC}$ resets to $V_{G\_load}$. This equalization leads to an improvement in sensing speed. Later in the second operating stage, the equalization signal, (EQ) becomes low which decouples the sensing circuit output node 403 from the adjustable load PMOS gate node 405. Thus, during the second operating stage, $V_{G\_load\_2nd}$ is generated based on $R_{data}$, and $V_{SA\_REF}$ is generated based on $R_{ref}$ and $V_{G\_load\_2nd}$.

The offset-cancelling dual stage sensing circuit 400 generates both $V_{data}$ and $V_{ref}$ at the same node, i.e., the sensing circuit output node 403. This provides offset cancellation, which improves tolerance of process variations. The adjustable load PMOS gate voltages $V_{G\_load\_1st}$ and $V_{G\_load\_2nd}$ provide a doubled sensing margin.

Figure 4B:
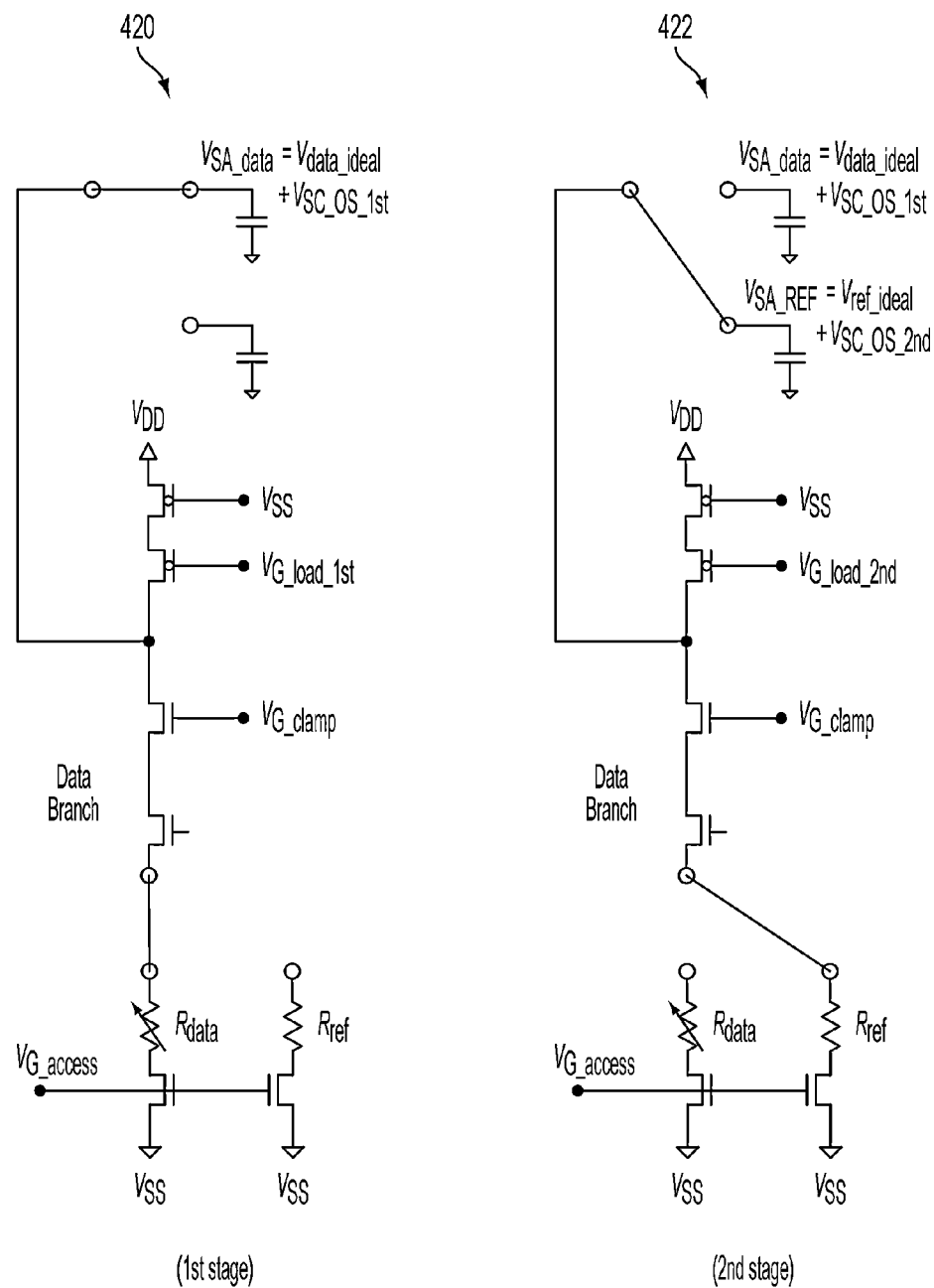
FIG. 4B is a diagram of each operating stage in an offset-cancelling dual stage sensing circuit according to aspects of the present disclosure.

The function of the offset-cancelling dual stage sensing circuit 400 is described further with reference to FIG. 4B. During the first operating stage 420, $R_{data}$ is sensed ($V_{SA\_data}$) using $V_{G\_load\_1st}$ generated by $R_{ref}$. During the second operating stage 422, $R_{ref}$ is sensed ($V_{SA\_REF}$) using $V_{G\_load\_2nd}$ generated by $R_{data}$. By comparing $V_{SA\_data}$ with $V_{SA\_REF}$, the effect of process variation can be canceled out.

The ideal reference voltage $V_{ref}$ of an MRAM sensing circuit is defined as $$V_{ref\_ideal}=(V_{data0\_ideal}+V_{data1\_ideal})/2$$

With regard to offset cancellation, it can be assumed that $V_{G\_load\_1st}$ and $V_{G\_load\_2nd}$ are identical. Because $V_{SA\_data}$ and $V_{SA\_REF}$ are affected by the same load PMOS and the same clamp NMOS, they are subject to identical variation in the load PMOS and clamp NMOS. Thus, the sensing circuit offset voltage $V_{SC\_OS}$ during the first operating stage 420 becomes almost the same as the sensing circuit offset voltage $V_{SC\_OS}$ during the second operating stage 422. If it is assumed that $V_{SC\_OC}$ at each stage is identical, i.e., $V_{SC\_OS\_1st}=V_{SC\_OS\_2nd}=V_{SC\_OS}$, then, $$V_{SA\_data}=V_{data\_ideal}+V_{SC\_OS},$$

$$V_{SA\_REF}=V_{ref\_ideal}+V_{SC\_OS}$$

$$\Delta V=|V_{SA\_data}-V_{SA\_REF}|=|V_{data\_ideal}-V_{ref\_ideal}|=\\|V_{data\_ideal}-(V_{data0\_ideal}+V_{data1\_ideal})/2|=\\|(V_{data1\_ideal}-V_{data0\_ideal})/2|=\Delta V_{ideal}$$

Figure 4C:
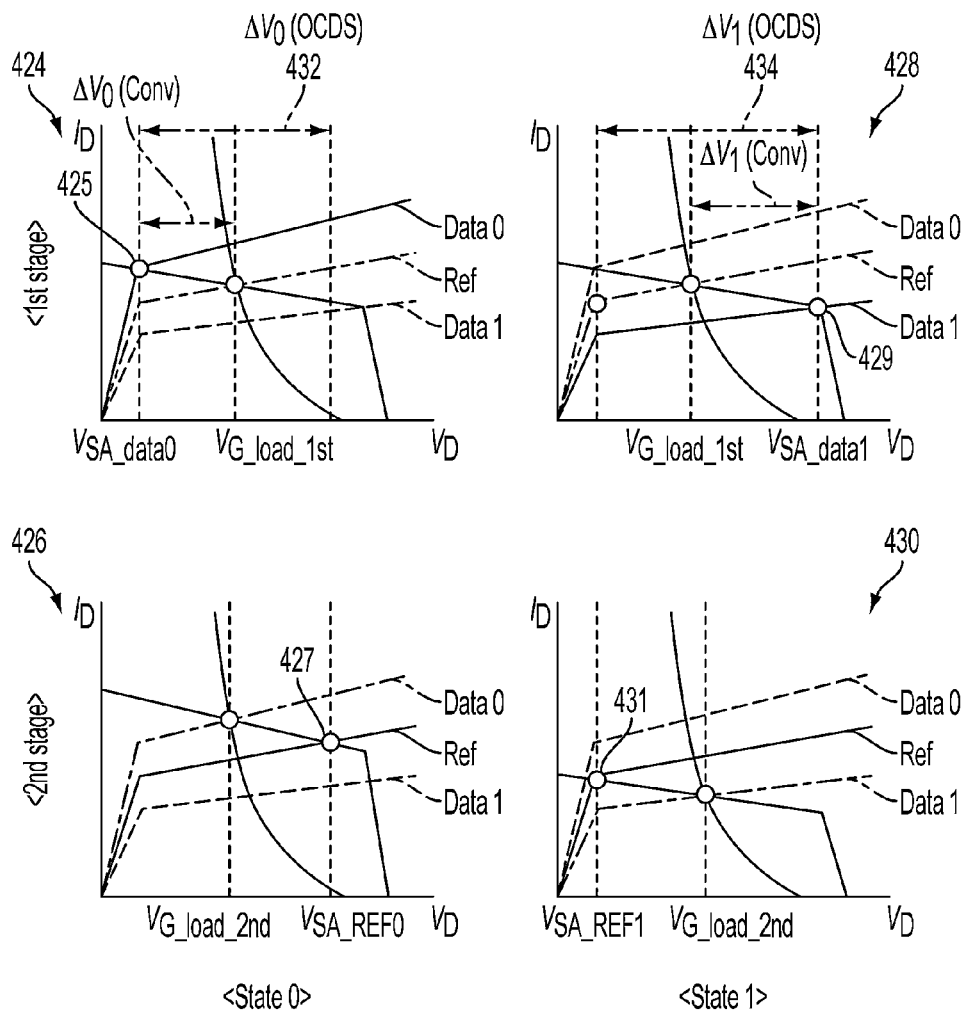
FIG. 4C is a graph showing voltage-current relationships of the offset-cancelling dual stage sensing circuit show in FIG. 4A.

FIG. 4C illustrates the current-voltage (I-V) curves of the data path clamp NMOS ($NC_D$), the reference path clamp NMOS ($NC_R$), the reference path load PMOS and the data path load PMOS for the first operating stage and the second operating stage of the offset-cancelling dual stage sensing circuit 400 shown in FIG. 4A. The crossing point between I-V curves of a clamp NMOS and a corresponding load PMOS represents an operating point of the respective operating stage. The first stage I-V curve 424 for data state 0 shows a $V_{SA\_data0}$ operating point 425 that is about the same as $V_{SA\_data0}$ in a conventional sensing circuit, as shown in FIG. 3B, for example. However, the second stage I-V curve 426 for data state 0 shows a $V_{SA\_REF0}$ operating point 427 at a significantly higher voltage than the conventional sensing circuit. The $V_{G\_load}$ during the second operating stage ($V_{G\_load\_2nd}$) is adjusted according to the data and $V_{SA\_REF}$ is determined by I-V curves of the clamp NMOS with the reference cell and the load PMOS with the $V_{G\_load\_2nd}$. Thus, $\Delta V_0$ 432 of the offset-cancelling dual stage sensing circuit 400 is increased by around two-fold compared to that of a conventional sensing circuit.

The first stage I-V curve 428 for data state 1 shows a $V_{SA\_data1}$ operating point 429 that is about the same as $V_{SA\_data1}$ in a conventional sensing circuit, as shown in FIG. 3B, for example. However, the second stage I-V curve 430 for data state 1 shows a $V_{SA\_REF1}$ operating point 431 at a significantly lower voltage than the conventional sensing circuit. Thus, $\Delta V_1$ 434 of the offset-cancelling dual stage sensing circuit 400 is increased by around two-fold compared to that of a conventional sensing circuit.

The offset-canceling dual stage sensing circuit (OCDS-SC) 400 can be applied to STT-RAM in deep submicron technology nodes to provide both offset cancelation and a doubling of the MTJ the sensing margin.

Unlike a conventional sensing circuit, the OCDS-SC 400 exhibits a very small variation in output voltage distribution. Because of the very small variation in the output voltage distribution ($\sigma_{\Delta VSC0,1}$) of the OCDS-SC 400, the offset voltage (VSA_OS) of the second stage sense amplifier (SA) in the OCDS-SC can significantly impact the read access pass yield per bit (RAPYCELL). RAPYCELL of the OCDS-SC 400 is very sensitive to the $\sigma_{SA\_OS}$ because of the small $\sigma_{\Delta VSC0,1}$. Unlike conventional sensing circuits, the RAPYCELL sensitivity of the OCDS-SC 400 increases as the sensing current decreases. Because of the very small $\sigma_{\Delta VSC0,1}$ of the OCDS-SC, a second stage SA with a very small $\sigma_{SA\_OS}$ can significantly improve the sensing margin and sensing speed.

Read access pass yield per bit (RAPYCELL) can be obtained by combining the distributions of $V_{SA\_OS}$ and $\Delta V_{SC0,1}$ ($=|V_{SA\_data0,1}-V_{SA\_REF0,1}|$) as follows:

$$RAPY_{CELL0,1} = \frac{\mu_{\Delta V_{SC_{0,1}}} - \mu_{SA\_OS}}{\sqrt{\sigma_{\Delta V_{SC_{0,1}}}^2 + \sigma_{SA\_OS}^2}} \text{ and}$$

$$RAPY_{CELL} = \min(RAPY_{CELL0}, RAPY_{CELL1})$$

As set forth above, $\mu_{\Delta VSC0,1}$ and $\sigma_{\Delta VSC0,1}$ are the mean and standard deviation of $\Delta V_{SC0,1}$ of the OCDS-SC and $\mu_{SA\_OS}$ and $\sigma_{SA\_OS}$ are the mean and standard deviation of $V_{SA\_OS}$. Here, it is assumed that $\mu_{SA\_OS}$=0 V. In one example, if $\sigma_{\Delta VSC0,1}$ is negligible, when $\sigma_{SA\_OS}$=20 mV then RAPYCELL of 6σ can be achieved with $\mu_{\Delta VSC}$=120 mV. However, in another example, when $\sigma_{SA\_OS}$=5 mV, RAPYCELL of 6σ can be achieved with $\mu_{\Delta VSC}$=30 mV. Thus, the sensing delay (i.e., delay from a word line signal (WL) to a sense amplifier enable signal (SAE)) can be decreased by approximately one-fourth or the sensing margin can be improved significantly by implementing a second stage SA with a very small $\sigma_{SA\_OS}$.

In addition, as $\sigma_{SA\_OS}$ decreases, the sensing current satisfying the target RAPYCELL of 6σ can be decreased significantly because of the improvement of the RAPYCELL, leading to the improvement in the read disturbance margin.

In one example, a target sensing current of 12 μA can be used to a satisfied read disturbance pass yield greater than 6σ. A target one-stage sensing time of 1.5 ns corresponds to a dual-stage sensing time of 3 ns, which is comparable to the sensing time of a conventional sensing circuit. For a sensing current of 12 μA, and sensing time of 1.5 ns, the output voltage range being sensed is about 0.2 V to 0.6 V. Thus, a SA for the OCDS-SC 400 should exhibit a very small $V_{SA\_OS}$ in the SA input voltage range of 0.2 V to 0.6 V.

Two SA input voltages, $V_{SA\_data}$ and $V_{SA\_REF}$, are generated with a time-difference because of the dual-stage operation of the OCDS sensing circuit. During the first stage, $V_{SA\_data}$ enters into the SA. During the second stage, after the first stage, $V_{SA\_REF}$ enters into the SA. If the two SA input nodes are connected through parasitic capacitors, a capacitive coupling can occur, which significantly degrades yield. To eliminate the capacitive coupling problem, the following SA input policy for the OCDS-SC should be used. First, the two input voltages ($V_{SA\_data}$ and $V_{SA\_REF}$) should be stored in two completely isolated switched capacitors CSC. Second, the two stored voltages should be applied to the SA input nodes at the same time.

Figure 5A:
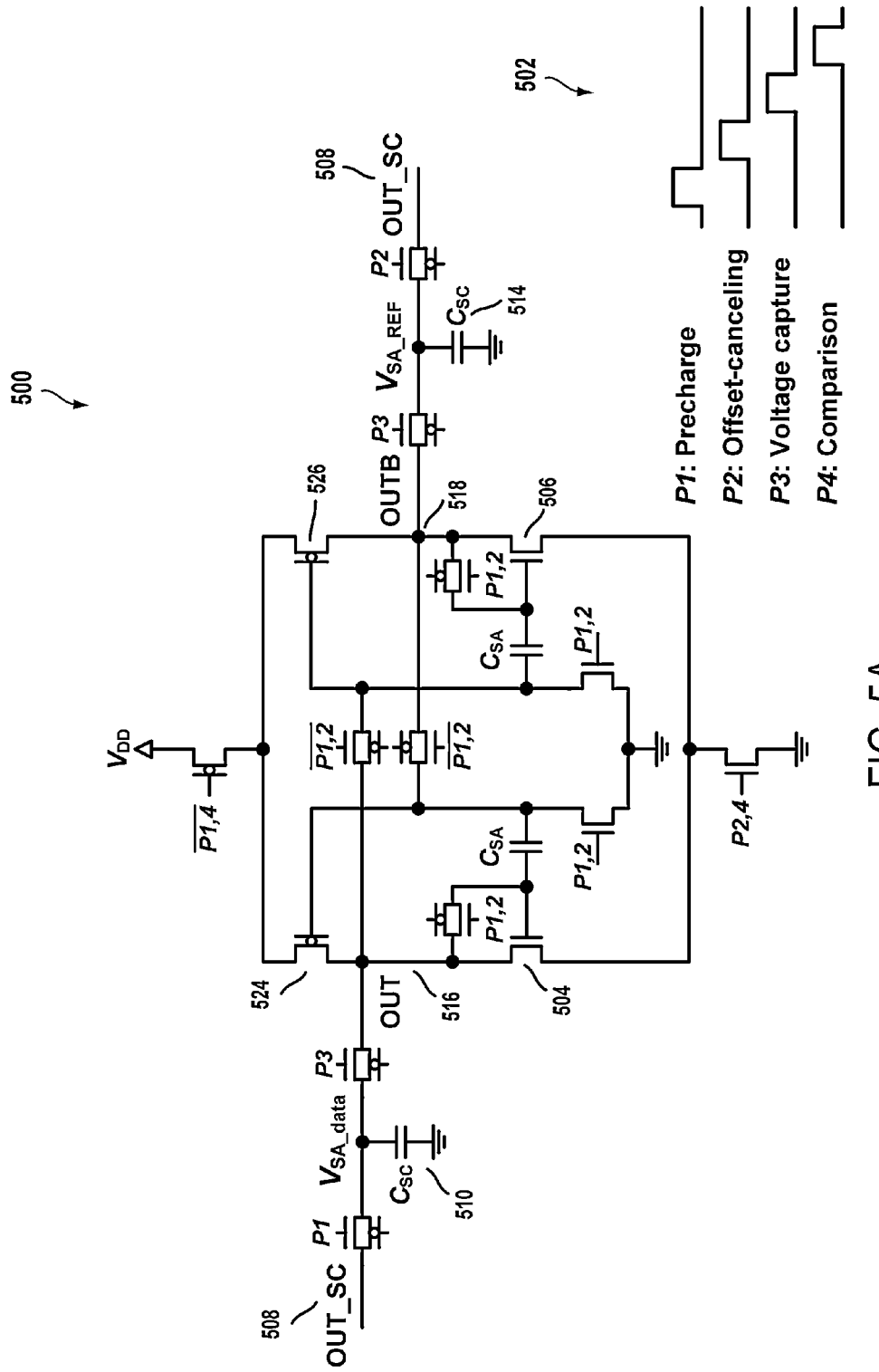
FIGS. 5A to 5E are diagrams of a conventional voltage latched sense amplifier.

An existing NMOS offset-cancelling voltage latched sense amplifier (NOC-VLSA) is described with reference to FIGS. 5A-5E. Referring to FIG. 5A, a NOC-VLSA 500 is responsive to a sequence of four signals 502 during a corresponding four phases of operation. In a first phase of operation, i.e., the pre-charge phase, nodes of the NOC-VLSA 500 that are labeled P1 are energized. In a second phase of operation, i.e., the offset-cancelling phase, nodes of the NOC-VLSA 500 that are labeled P2 are energized. In a third phase of operation, i.e., the voltage capture phase, nodes of the NOC-VLSA 500 that are labeled P3 are energized. In a fourth phase of operation, i.e., the comparison phase, nodes of the NOC-VLSA 500 that are labeled P4 are energized. Nodes of the NOC-VLSA 500 that are labeled P1_bar are energized when nodes labeled P1 are not energized; nodes of the NOC-VLSA 500 that are labeled P2_bar, are energized when nodes labeled P2 are not energized; nodes of the NOC-VLSA 500 that are labeled P3_bar are energized when nodes labeled P3 are not energized; and nodes of the NOC-VLSA 500 that are labeled P4_bar are energized when nodes labeled P4 are not energized.

The offset voltage $V_{SA\_OS}$ is determined by latch NMOS transistors 504, 506 and latch PMOS transistors 524, 526. When $V_{SA\_data}$ and $V_{SA\_REF}$ are small (e.g., 0V to 0.3V), $V_{SA\_OS}$ is predominantly determined by latch PMOS transistors 524, 526. On the other hand, when $V_{SA\_data}$ and $V_{SA\_REF}$ are large (e.g., 0.7V to 1.0V), $V_{SA\_OS}$ is predominantly determined by latch NMOS transistors 504, 506. The latch NMOS transistors 504, 506 are included in a latch circuit along with latch PMOS transistors 524, 526. The NOC-VLSA 500 cancels threshold voltage ($V_{TH}$) mismatch of the latch NMOS transistors 504, 506 during the pre-charge phase (P1) and the offset-canceling phase (P2).

Figure 5B:
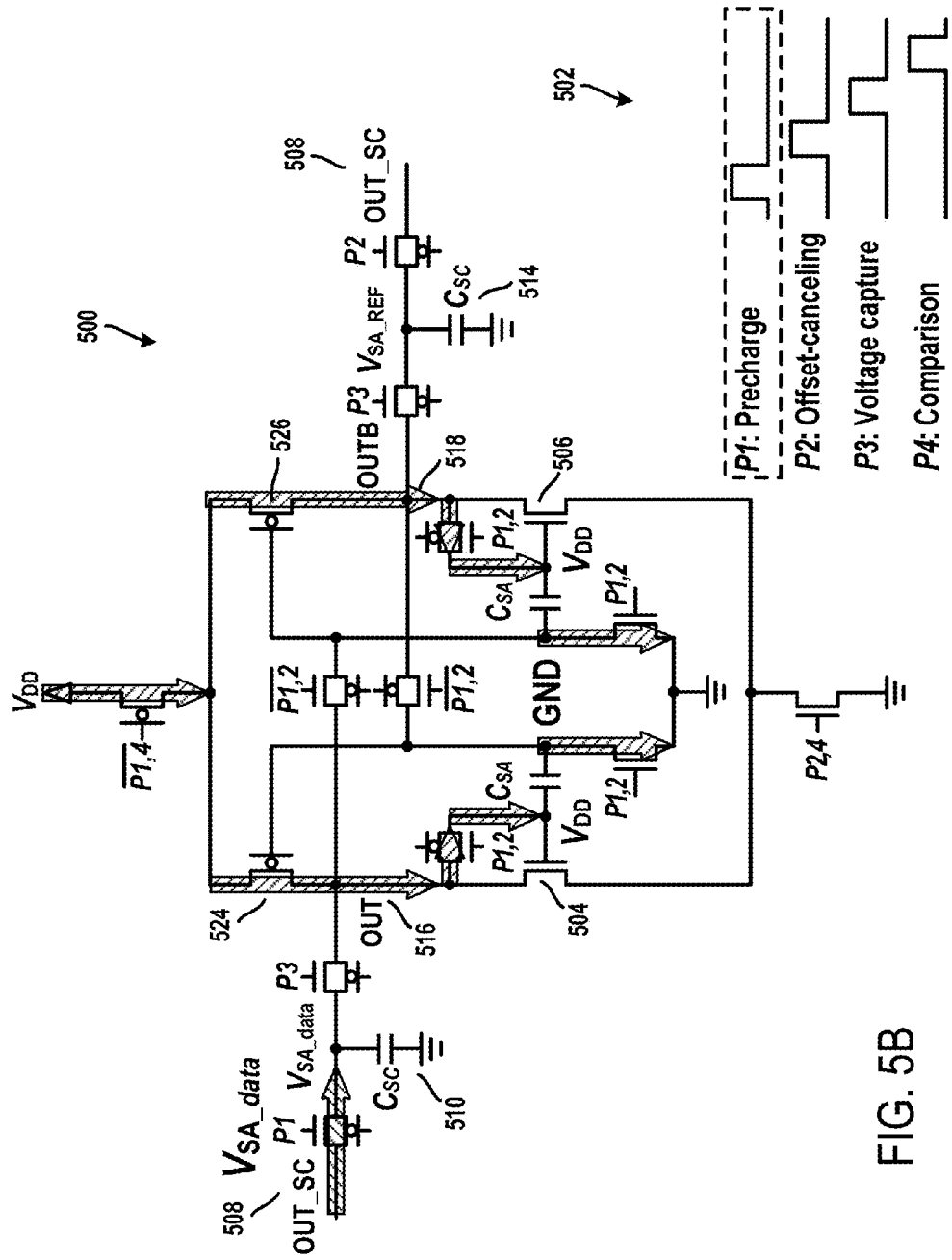

The pre-charge phase of operation (P1) for the NOC-VLSA 500 is described with reference to FIG. 5B. During the pre-charge phase (P1), the respective gates of the latch NMOS transistors 504, 506 are pre-charged to a source voltage ($V_{DD}$). An output node 508 of an offset-cancelling dual stage sensing circuit OCDS-SC, such as the OCDS-SC 400 (FIG. 4) provides a data input voltage ($V_{SA\_data}$), which is stored in a first isolated switched capacitor ($C_{SC}$) 510.

Figure 5C:
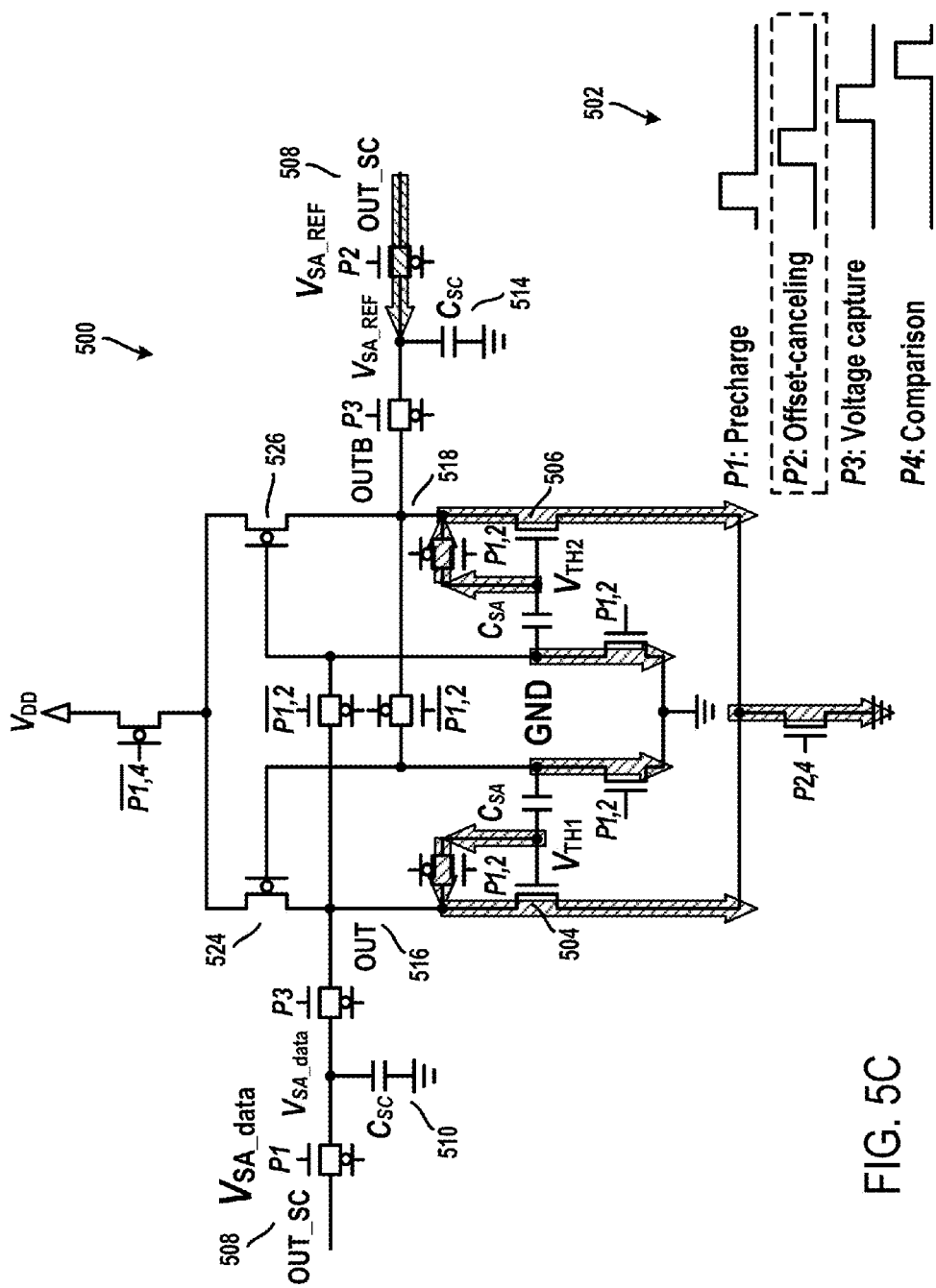

The offset-cancelling phase of operation (P2) for the NOC-VLSA 500 is described with reference to FIG. 5C. During the offset-cancelling phase (P2), the respective gates of the latch NMOS transistors 504, 506 are de-coupled from the source voltage ($V_{DD}$) and discharged to their respective threshold voltages. Thus, the offset of the latch NMOS transistors 504, 506 is cancelled out. During the offset-cancelling phase (P2), the output node 508 from the offset-cancelling dual stage sensing circuit OCDS-SC provides a reference input voltage ($V_{SA\_REF}$), which is stored in a second isolated switched capacitor ($C_{SC}$) 514.

Figure 5D:
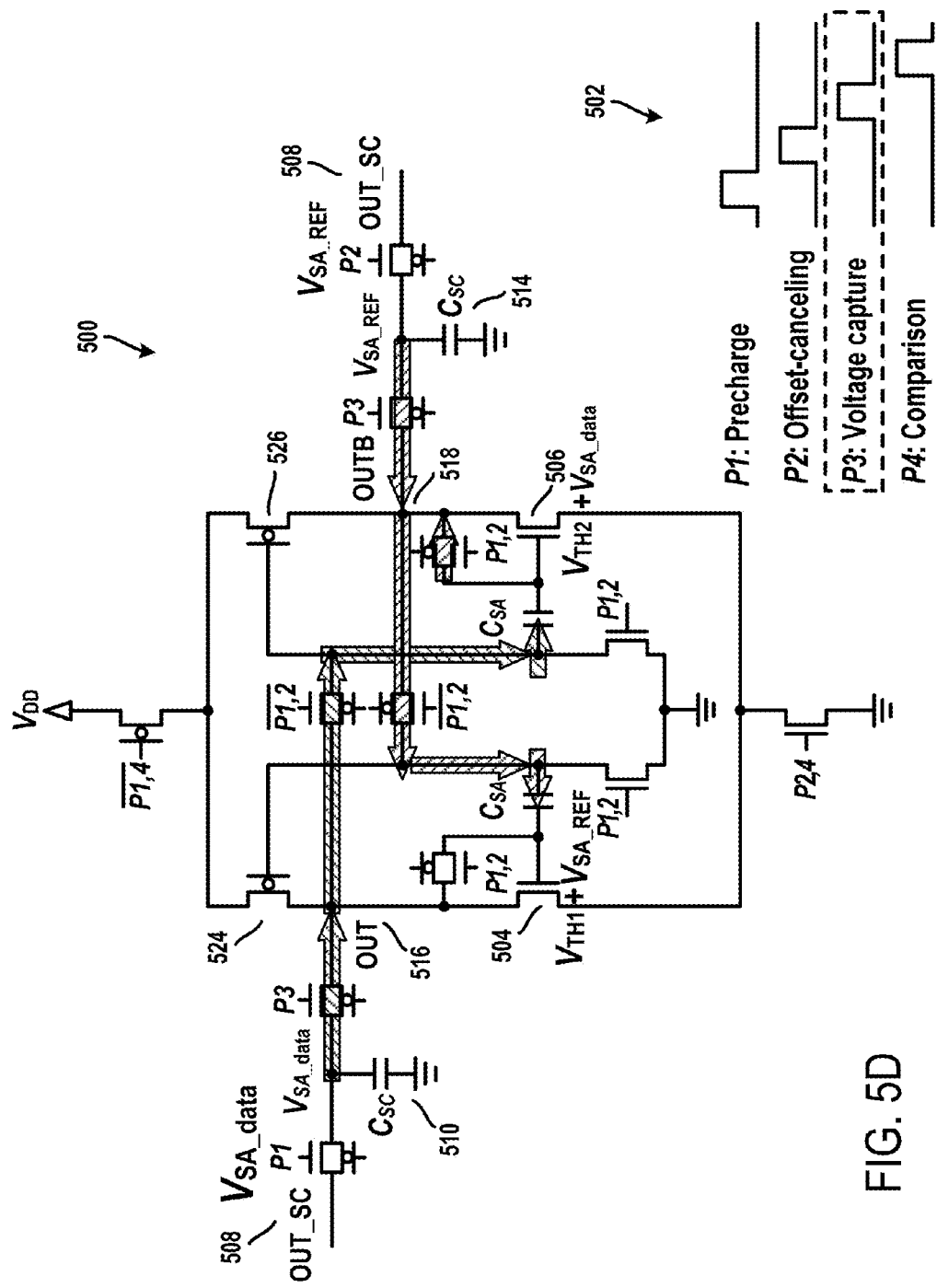

The voltage capture phase of operation (P3) for the NOC-VLSA 500 is described with reference to FIG. 5D. In the voltage capture phase (P3), $V_{SA\_data}$ is provided from the first isolated switched capacitor ($C_{SC}$) 510 and captured at the gate of a first one of the latch NMOS transistors 504. The reference input voltage ($V_{SA\_REF}$) is provided from the second isolated switched capacitor ($C_{SC}$) 514 and captured at the gate of a second one of the latch NMOS transistors 506. Because the overdrive voltage, ($V_{GS}$-$V_{TH}$), which determines driving current of the latch NMOS transistors 504, 506, does not depend on the threshold voltage $V_{TH}$ variation, NMOS offset-canceling is achieved.

Figure 5E:
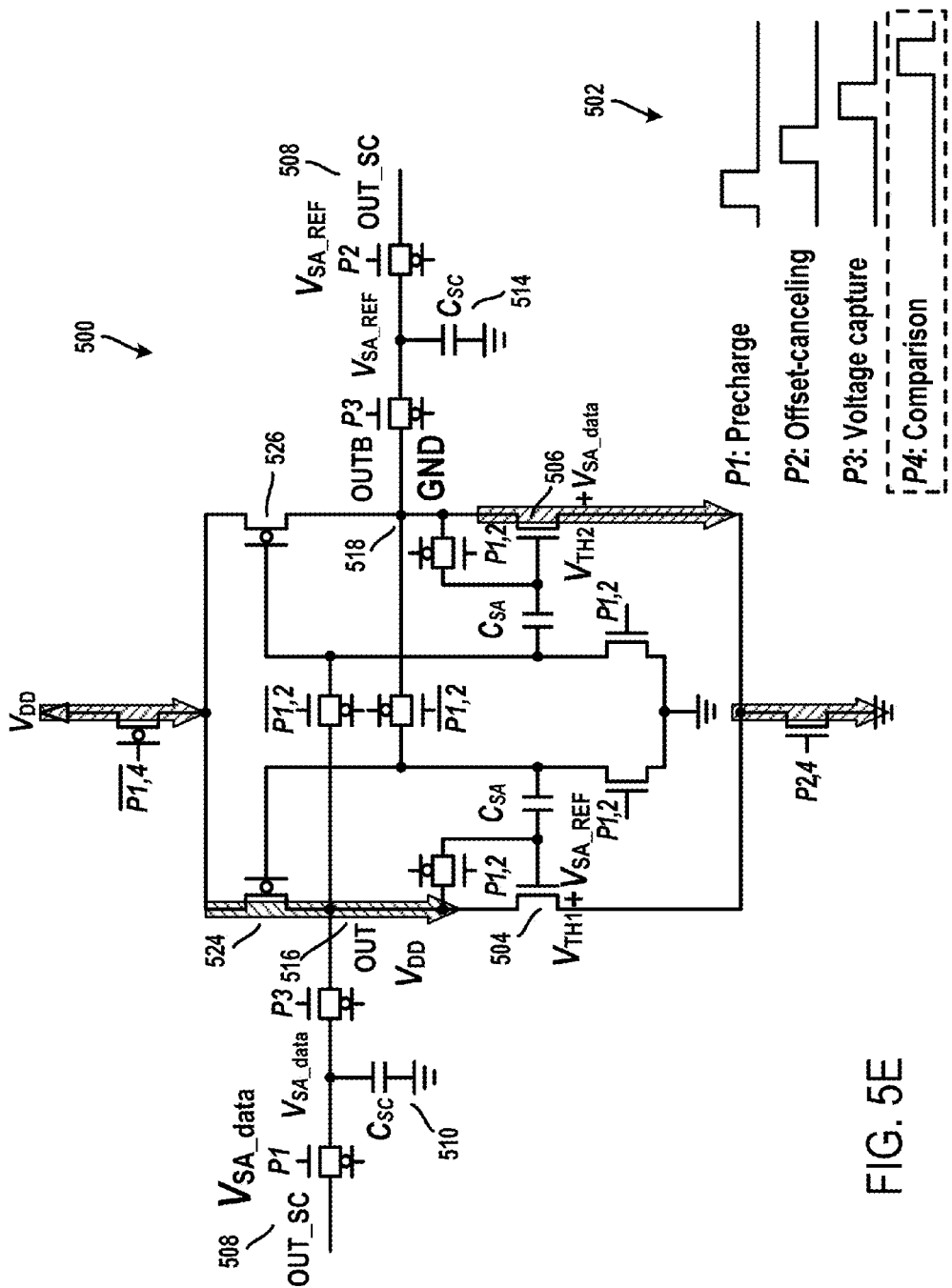

The comparison phase of operation (P4) for the NOC-VLSA 500 is described with reference to FIG. 5E. When the input data voltage ($V_{SA\_data}$) is greater than the input reference voltage ($V_{SA\_REF}$) in the comparison phase, a first output node 516 (OUT) of the latch circuit is coupled to a source voltage ($V_{DD}$) and a second output node 518 (OUTB) of the latch circuit is coupled to a ground node (GND). When the input reference voltage ($V_{SA\_REF}$) is higher than the input data voltage ($V_{SA\_data}$) in the comparison phase, the first output node 516 (OUT) of the latch circuit is coupled to the ground node (GND) and the second output node 518 (OUTB) of the latch circuit is coupled to the source voltage node ($V_{DD}$).

The input capacitance of the NOC-VLSA 500 is very large. The NOC-VLSA 500 includes about thirteen junction capacitances and two gate capacitances. The large input capacitance substantially degrades the voltage difference $\Delta V_{in}$ between the input data voltage ($V_{SA\_data}$) and the input reference voltage ($V_{SA\_REF}$) during the voltage capture phase of operation (P3).

To reduce the charge sharing loss and achieve a proper $\Delta V_{in}$, the capacitance of the isolated switch capacitors ($C_{SC}$) 510, 514 should be much larger than the input capacitance (Cin) as shown in the following equation.

$$C_{SC} V_{SA\_data} = (C_{SC} + C_{in}) V_{in}$$

$$V_{in} = \frac{C_{SC}}{C_{SC} + C_{in}} V_{SA\_data}, \quad V_{inb} = \frac{C_{SC}}{C_{SC} + C_{in}} V_{SA\_REF}$$

$$\Delta V_{in} = |V_{in} - V_{inb}| = \frac{C_{SC}}{C_{SC} + C_{in}} |V_{SA\_data} - V_{SA\_REF}|$$

Nevertheless, the capacitance of the isolated switching capacitors ($C_{SC}$) 510, 514 in the NOC-VLSA 500 is limited for sensing output from an OCDS-SC because a larger capacitance of the $C_{SC}$ 510, 514 causes a large sensing delay of the OCDS-SC. Moreover if the size of latch NMOS transistors 504, 506 in the NOC-VLSA 500 is increased to reduce the sense amplifier offset voltage ($V_{SA\_OS}$) of the NOC-VLSA 500, then the input capacitance ($C_{in}$) of the NOC-VLSA 500 is increased and results in further charge sharing loss.

The large number of components for NMOS-offset-canceling that are connected to the output nodes in the NOC-VLSA 500 can cause significant output capacitance mismatch. Because the sense amplifier offset voltage ($V_{SA\_OS}$) is a function of not only $V_{TH}$ mismatch but also the output capacitance mismatch, this output capacitance mismatch can reduce the effect of the NMOS-offset-canceling.

The NOC-VLSA 500 cancels only the $V_{TH}$ mismatch that is caused by latch NMOS transistors 504, 506. The variation ($\sigma_{SA\_OS}$) of the NOC-VLSA 500, however, is affected by both latch NMOS transistors 504, 506 and latch PMOS transistors 524, 526. When $V_{SA\_data}$ is low (e.g., <0.3 V), $\sigma_{SA\_OS}$ of the NOC-VLSA 500 is predominantly determined by the latch PMOS transistors 524, 526. Therefore, $\sigma_{SA\_OS}$ increases as $V_{SA\_data}$ decreases when $V_{SA\_data}$ is low.

Due to the large input capacitance, the output capacitance mismatch and sensitivity to latch PMOS transistor offset, which are exhibited by the NOC-VLSA 500 as described above, the NOC-VLSA 500 is not well suited for use with an OCDS-SC.

Figure 6A:
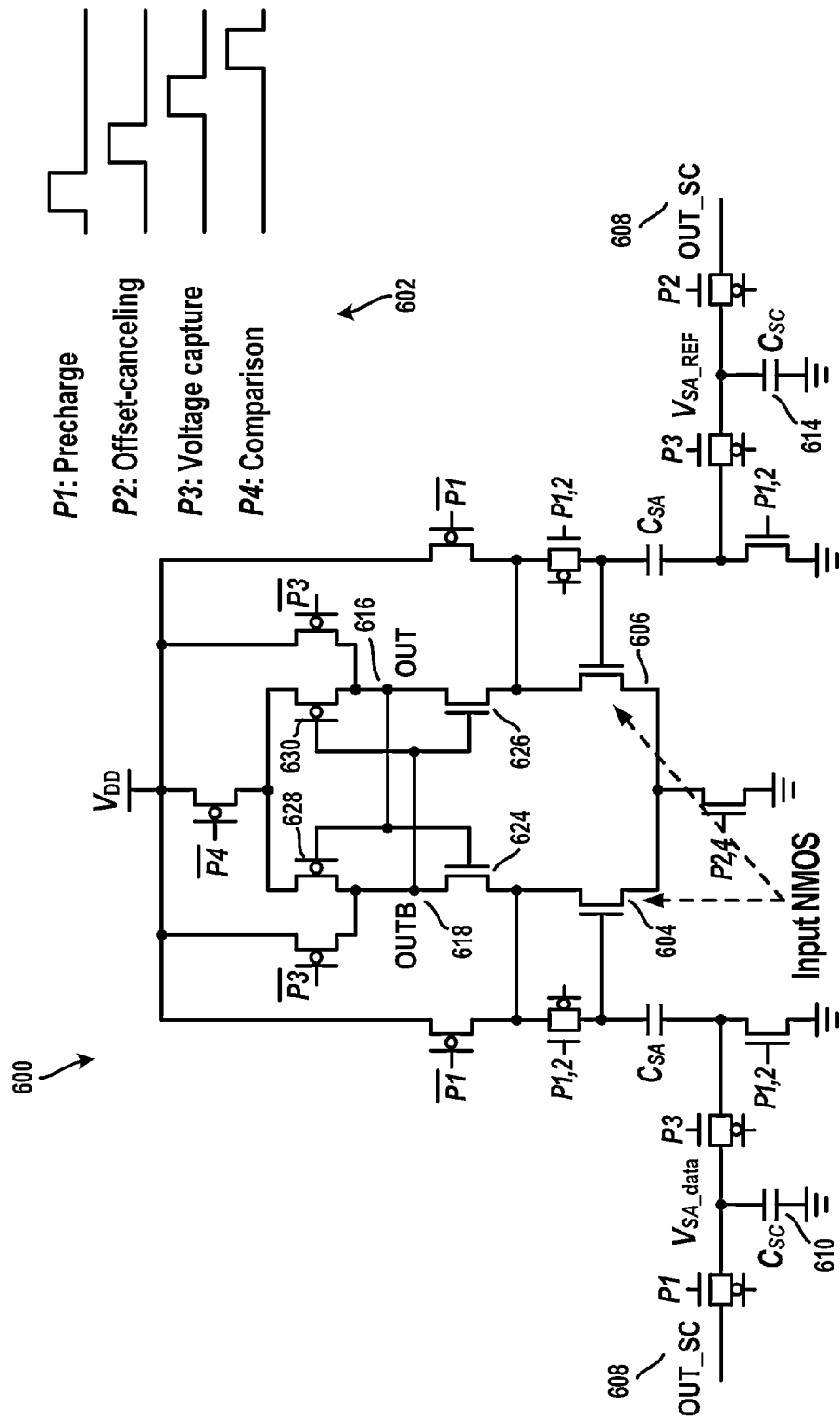
FIGS. 6A to 6E are diagrams of an offset-cancelling current latched sense amplifier according to an aspect of the present disclosure.

An NMOS offset-cancelling current latched sense amplifier (NOC-CLSA), which overcomes the drawbacks of the existing NOC-VLSA such as the large input capacitance, large output capacitance mismatch and sensitivity to latch PMOS transistor offset, and which is suitable for use with an OCDS-SC according to an aspect of the present disclosure, is described with reference to FIGS. 6A-6E. Referring to FIG. 6A, a NOC-CLSA 600 is responsive to a sequence of four signals 602 during a corresponding four phases of operation. In a first phase of operation, i.e., the pre-charge phase, nodes of the NOC-CLSA 600 that are labeled P1 are energized. In a second phase of operation, i.e., the offset-cancelling phase, nodes of the NOC-CLSA 600 that are labeled P2 are energized. In a third phase of operation, i.e., the voltage capture phase, nodes of the NOC-CLSA 600 that are labeled P3 are energized. In a fourth phase of operation, i.e., the comparison phase, nodes of the NOC-CLSA 600 that are labeled P4 are energized. Nodes of the NOC-CLSA 600 that are labeled P1_bar are energized when nodes labeled P1 are not energized; nodes of the NOC-CLSA 600 that are labeled P2_bar, are energized when nodes labeled P2 are not energized; nodes of the NOC-CLSA 600 that are labeled P3_bar are energized when nodes labeled P3 are not energized; and nodes of the NOC-CLSA 600 that are labeled P4_bar are energized when nodes labeled P4 are not energized.

The offset voltage $V_{SA\_OS}$ is predominantly determined by input NMOS transistors 604, 606. The input NMOS transistors 604, 606 are coupled to a latch circuit, which includes latch NMOS transistors 624, 626 and latch PMOS transistors 628, 630. According to an aspect of the present disclosure, the input NMOS transistors 604, 606 are not part of the latch circuit but are selectively coupled between the latch circuit and a first fixed voltage. By providing an input path that avoids the latch circuit, the NOC-CLSA 600 significantly reduces input capacitance Cin, compared to the NOC-VLSA 500, for example. The first fixed voltage is described herein as a ground (GND), however aspects of the present disclosure can include configurations in which the first fixed voltage is not necessarily a ground (GND). According to an aspect of the present disclosure, the NOC-CLSA 600 cancels the threshold voltage ($V_{TH}$) mismatch of the input NMOS transistors 604, 606 during the pre-charge phase (P1) and the offset-canceling phase (P2) of operation.

Figure 6B:
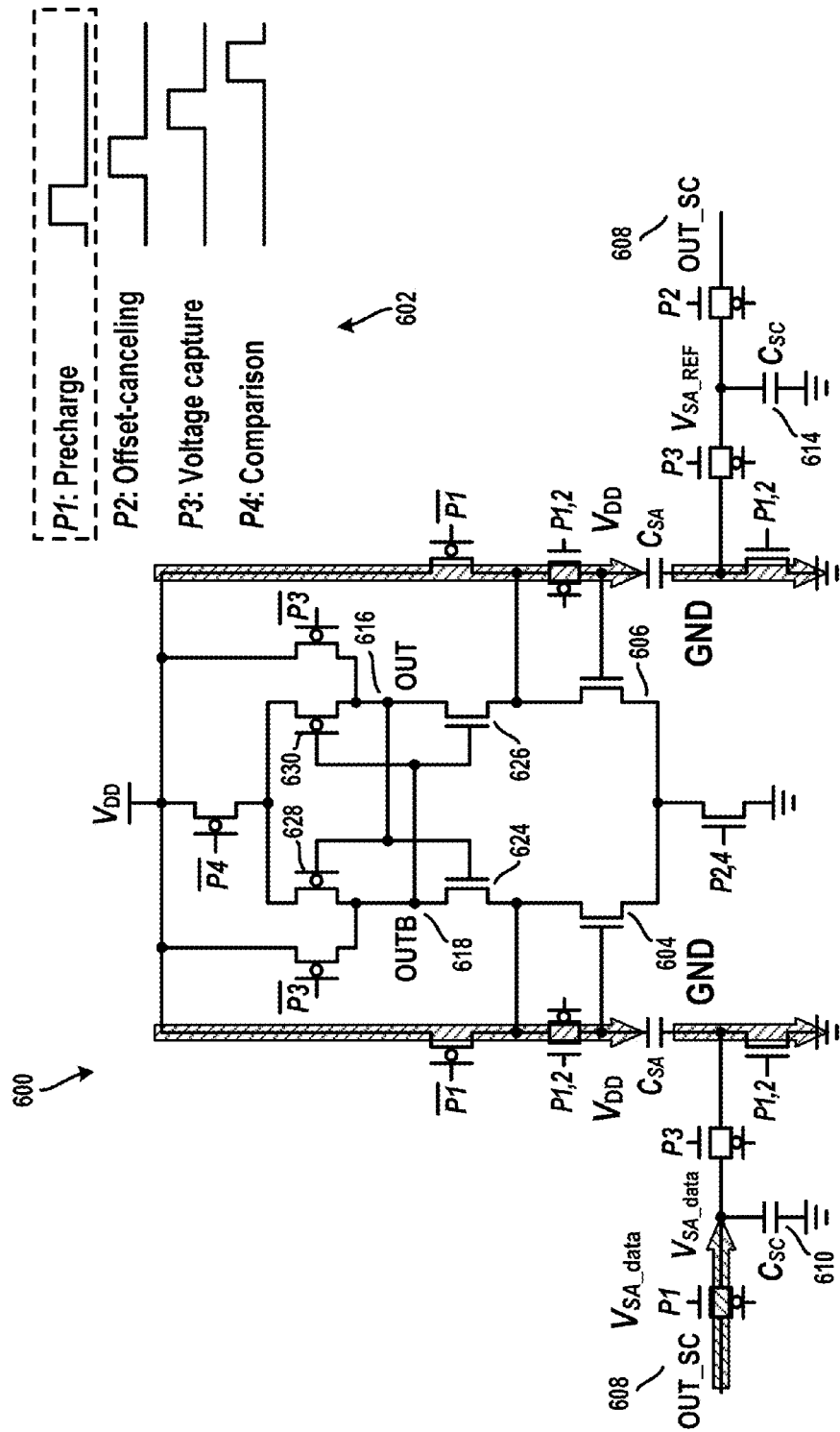

The pre-charge phase of operation (P1) for a NOC-CLSA 600 is described with reference to FIG. 6B. During the pre-charge phase (P1), the respective gates of the input NMOS transistors 604, 606 are pre-charged to a second fixed voltage.

The second fixed voltage is described as a source voltage ($V_{DD}$), however, aspects of the present disclosure can include configurations in which the second fixed voltage is not the source voltage ($V_{DD}$), for example. An output 608 from an offset-cancelling dual stage sensing circuit OCDS-SC, such as the OCDS-SC 400 (FIG. 4), provides a data input voltage ($V_{SA\_data}$) that is stored in a first isolated capacitor ($C_{SC}$) 610.

It should be understood that, although the terms first, second, etc. may describe various elements and/or components, these elements and/or components should not be limited by these terms. These terms are only used to distinguish one element and/or component from another element and/or component. Thus, a first element or component could be termed a second element or component without departing from the teachings of the present disclosure.

Figure 6C:
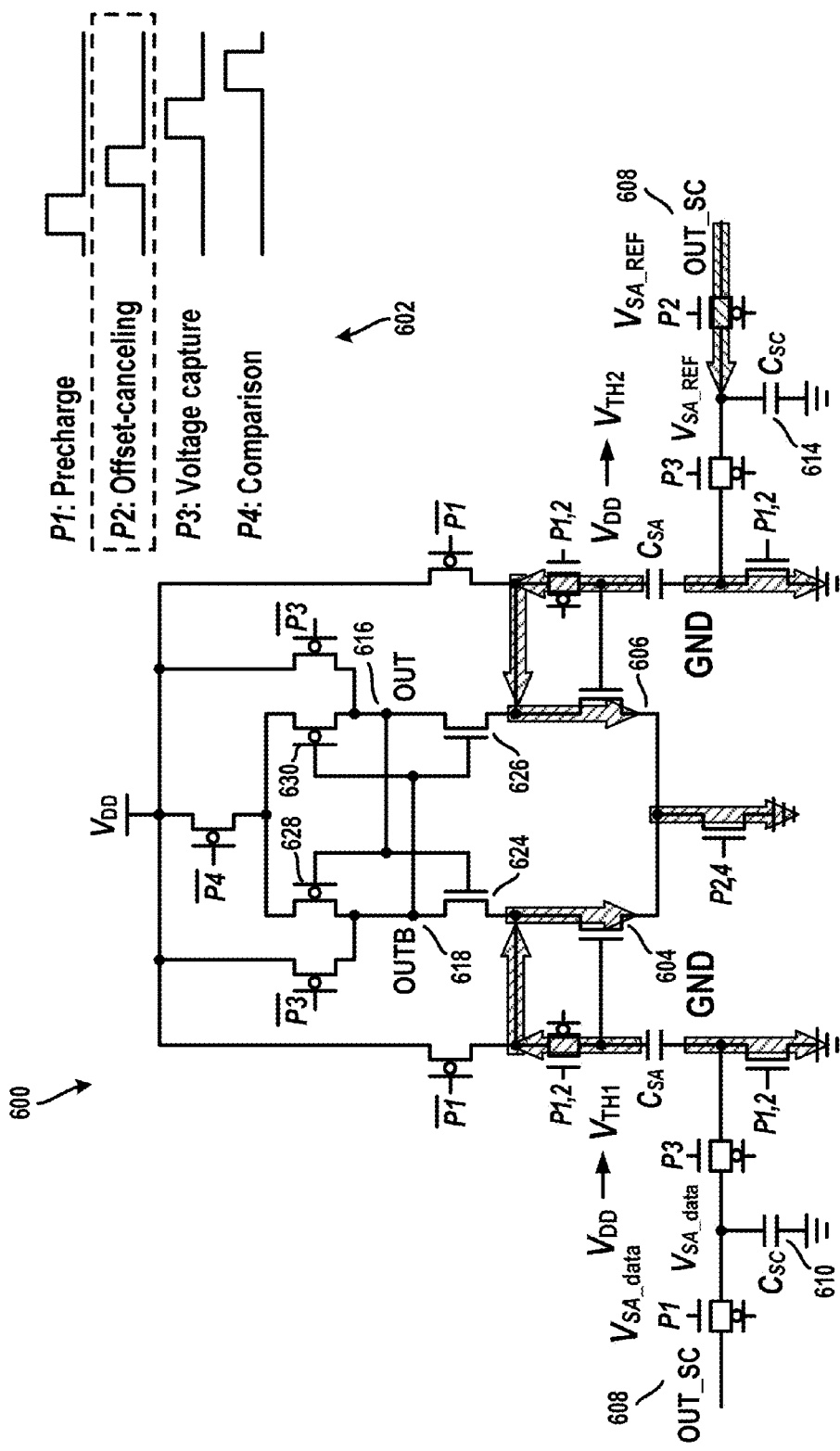

The offset-cancelling phase of operation (P2) for a NOC-CLSA 600 is described with reference to FIG. 6C. During the offset-cancelling phase (P2), the respective gates of the input NMOS transistors 604, 606 are de-coupled from the source voltage ($V_{DD}$) and discharged to their respective threshold voltages ($V_{TH}$). Thus the offset of the input NMOS transistors 604, 606 are cancelled out. During the offset-cancelling phase (P2), the output 608 from the offset-cancelling dual stage sensing circuit OCDS-SC provides a reference input voltage ($V_{SA\_REF}$), which is stored in a second isolated switched capacitor ($C_{SC}$) 614.

Figure 6D:
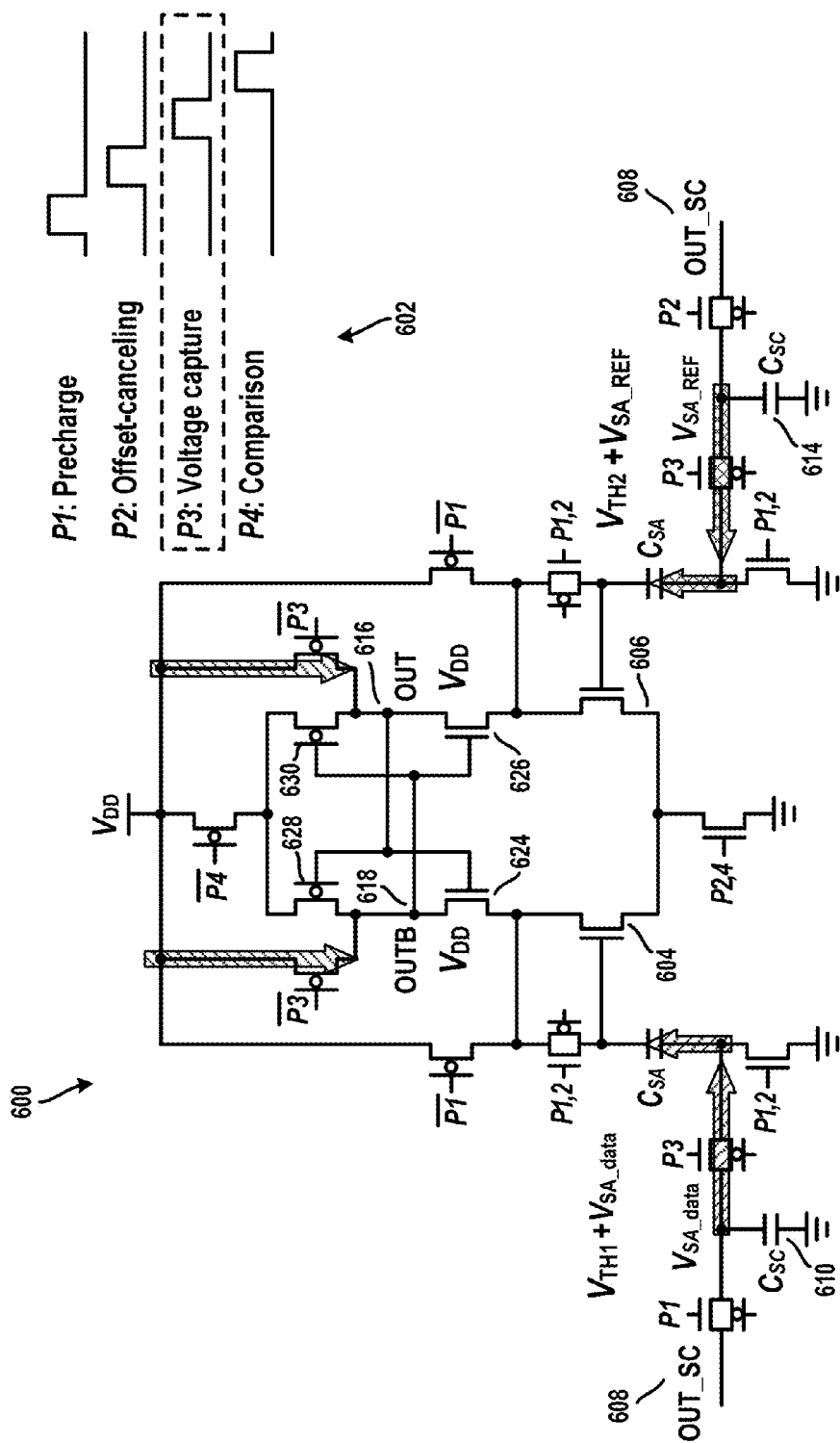

The voltage capture phase of operation (P3) for a NOC-CLSA 600 is described with reference to FIG. 6D. In the voltage capture phase (P3), the data voltage ($V_{SA\_data}$) is provided from first isolated capacitor ($C_{SC}$) 610 and captured at the gate of a first one of the input NMOS transistors 604. The reference voltage ($V_{SA\_REF}$) is provided from the second isolated capacitor ($C_{SC}$) 614 and captured at the gate of the second one of the input NMOS transistors 606. Because the overdrive voltage, ($V_{GS}$-$V_{TH}$), which determines driving current of the input NMOS transistors 604, 606, does not depend on the threshold voltage $V_{TH}$ variation, offset cancellation of the input NMOS transistors is achieved.

Figure 6E:
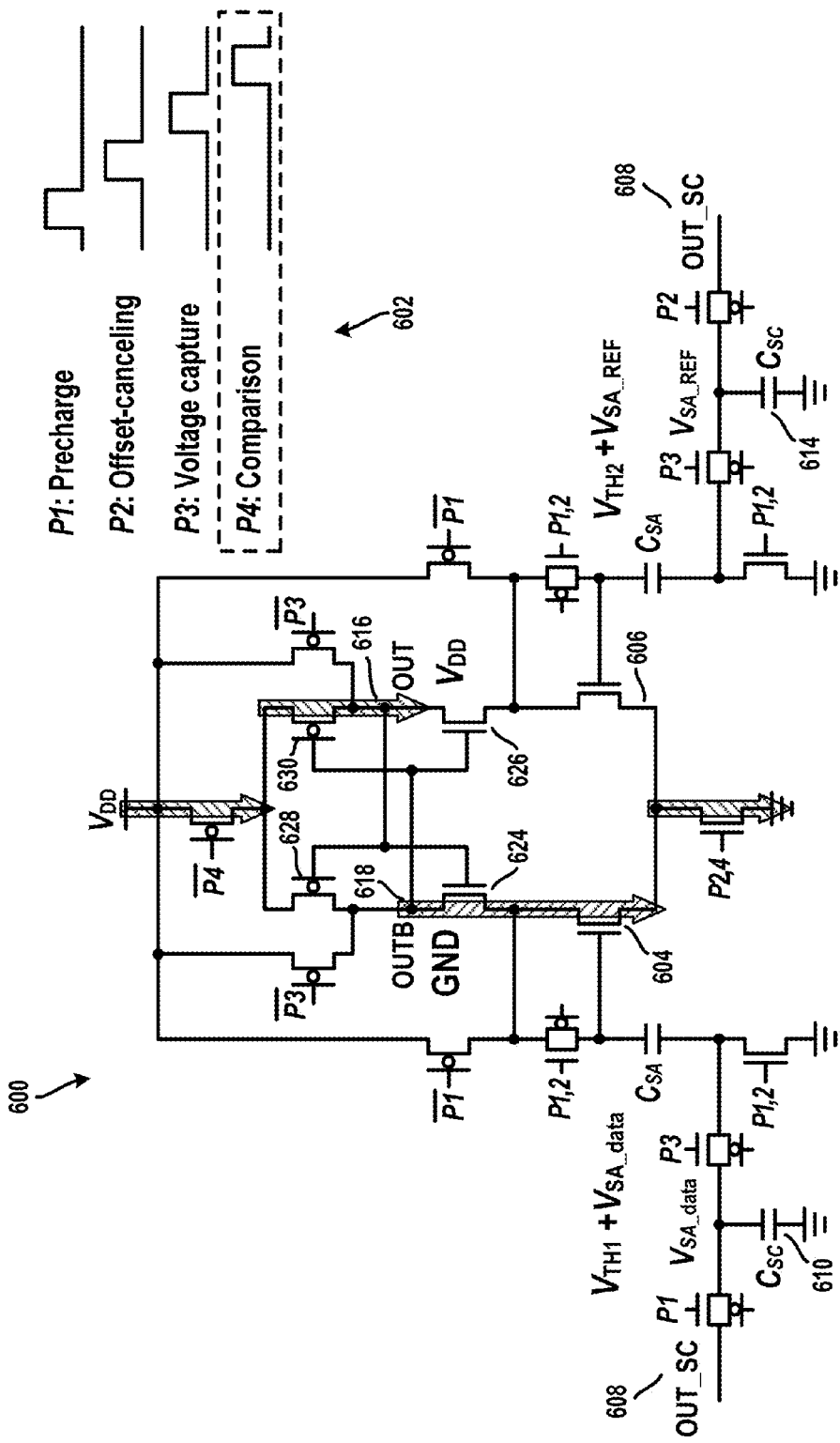

The comparison phase of operation (P4) for a NOC-CLSA 600 is described with reference to FIG. 6E. When the data voltage ($V_{SA\_data}$) is greater than the reference voltage ($V_{SA\_REF}$) in the comparison phase (P4), a first output node 616 (OUT) of the latch circuit is coupled to the source voltage ($V_{DD}$) and a second output node 618 (OUTB) is coupled to a ground node (GND). When the reference voltage ($V_{SA\_REF}$) is higher than the data voltage ($V_{SA\_data}$) in the comparison phase, the first output node 616 (OUT) is coupled to the ground node (GND) and the second output node 618 (OUTB) is coupled to the source voltage ($V_{DD}$).

Figure 7:
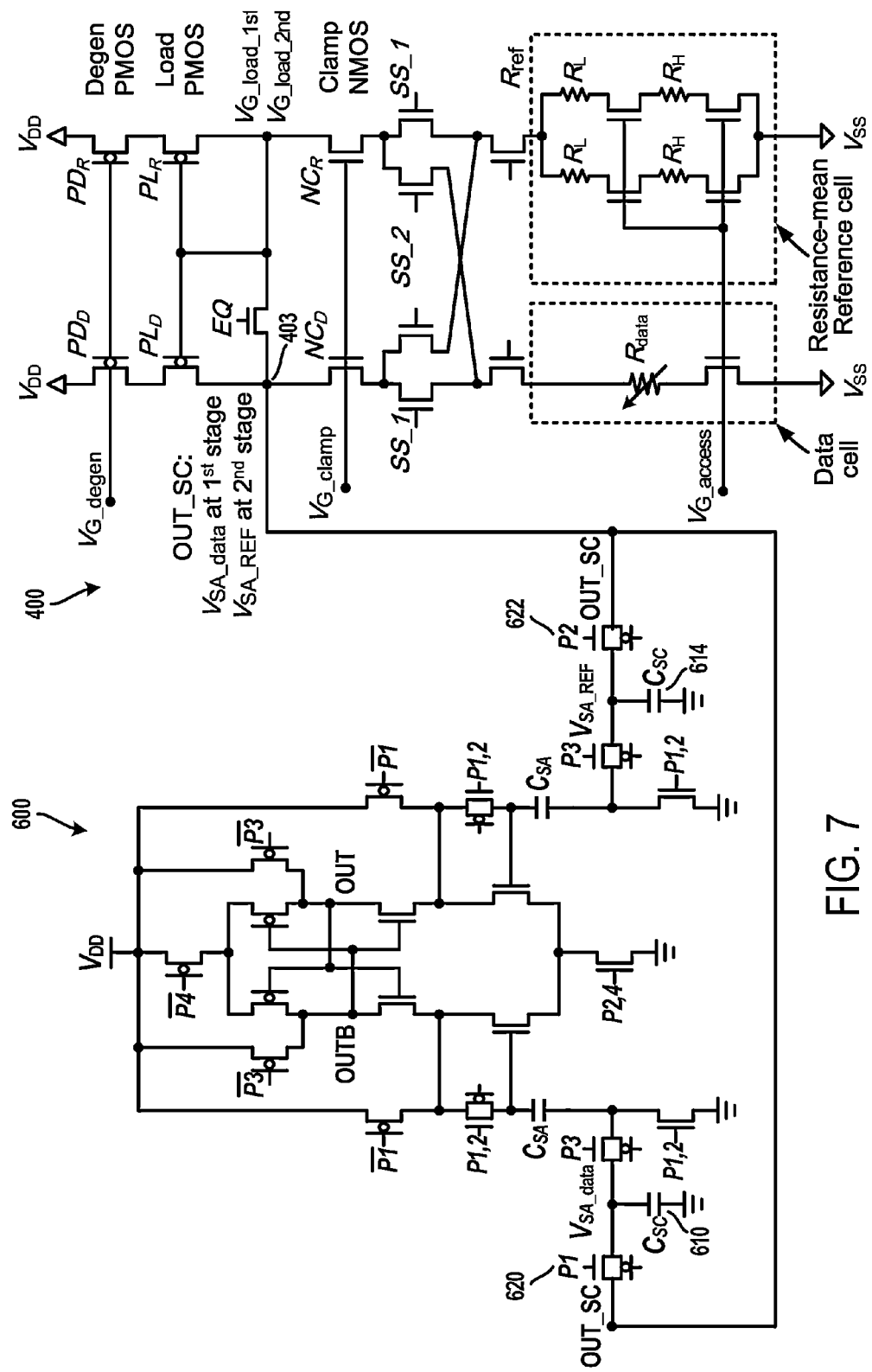
FIG. 7 is a diagram of an offset-cancelling dual stage sensing circuit coupled to an offset-cancelling current latched level sense amplifier according to an aspect of the present disclosure.

Referring to FIG. 7, according to an aspect of the present disclosure, the NOC-CLSA 600 as shown in FIGS. 6A-6E is coupled to an offset-cancelling dual stage sensing circuit (OCDS-SC) 400 as shown in FIG. 4A, for example. The sensing circuit output node 403 of the OCDS-SC 400 is coupled to the first isolated capacitor 610 of the NOC-CLSA 600 via a first pass gate 620, which is energized during the pre-charge phase (P1). The sensing circuit output node 403 of the OCDS-SC 400 is coupled to the second isolated capacitor 614 of the NOC-CLSA 600 via a second pass gate 622, which is energized during the offset-cancelling phase (P2).

Figure 8:
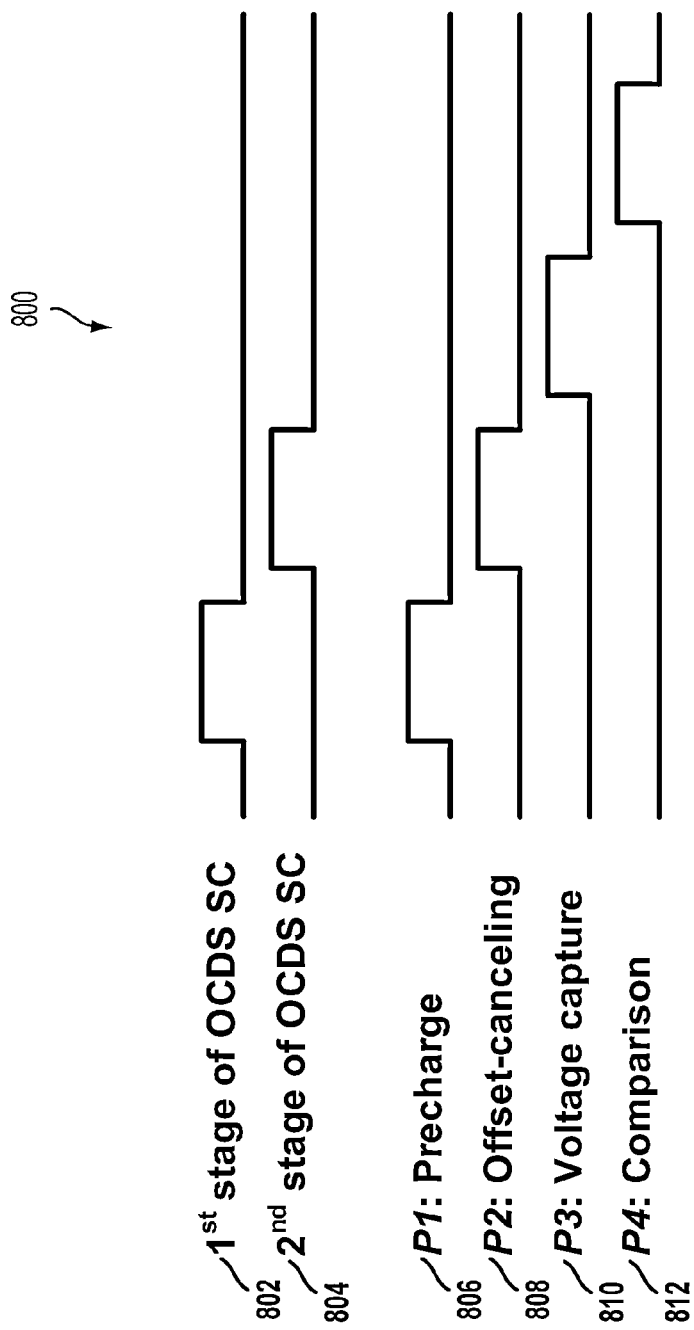
FIG. 8 is a timing diagram showing timing of the offset-cancelling dual stage sensing circuit and an offset-cancelling current latched sense amplifier shown in FIG. 7 according to an aspect of the present disclosure.

FIG. 8 shows timing diagram 800 of a first stage 802 and a second stage 804 of an OCDS-SC relative to timing of the respective phases (P1, P2, P3 and P4) of a NOC-CLSA according to aspects of the present disclosure. Referring to FIG. 8, a synergistic effect may be achieved by implementing the OCDS-SC together with the NOC-CLSA according to aspects of the present disclosure. Generally, an OCDS-SC can cause a sensing delay because of the dual stage sensing operation. However, the timing of the first stage 802 of the OCDS-SC and the pre-charge phase 806 (P1) of the NOC-CLSA are overlapped. The timing of the second stage 804 of the OCDS-SC and the offset-cancelling phase 808 (P2) of the NOC-CLSA are also overlapped. The voltage capture phase 810 (P3) and comparison phase 812 (P4) of the NOC-CLSA occur after the first stage 802 and second stage 804 of the OCDS-SC. Thus, by pipelining an OCDS-SC and a NOC-CLSA together according to aspects of the present disclosure as shown in FIG. 7, the sensing delay penalty of an OCDS-SC can be reduced or eliminated.

Unlike a conventional NOC-VLSA, which includes about thirteen junction capacitances and two gate capacitances, the NOC-CLSA includes only about five junction capacitances and one gate capacitance. Thus, the input capacitance Cin of the NOC-CLSA is much smaller than the input capacitance of a conventional NOC-VLSA. Due to the reduced charge sharing loss, the data voltage ($V_{SA\_data}$) and the reference voltage ($V_{SA\_REF}$) can be more efficiently transferred to the gate of the input NMOS transistors. Furthermore, the NOC-CLSA enables the use of smaller isolated capacitors ($C_{SC}$), which reduces the sensing delay of the OCDS-SC.

The structure of an NOC-CLSA, according to aspects of the present disclosure, includes portions of a conventional foot-switched current latched sense amplifier (FS-CLSA). Although a conventional FS-CLSA exhibits a dead zone below $V_{TH}+\alpha$ (some margin), the dead zone of the NOC-CLSA according to aspects of the present disclosure is substantially reduced in comparison. During the offset-cancelling phase of operation (P2), the minimum gate voltage of the input NMOS transistors becomes $V_{TH}$. Therefore, the sensing dead zone of the NOC-CLSA exists only below the margin, $\alpha$.

The NOC-CLSA includes fewer components coupled to the output node of the NOC-CLSA than are coupled to the output node of a conventional NOC-VLSA. Thus, the NOC-CLSA has much smaller output capacitance mismatch than a conventional NOC-VLSA.

In a conventional NOC-VLSA, a mismatch in the latch PMOS transistors limits the offset variation ($\sigma_{SA\_OS}$). By comparison, $\sigma_{SA\_OS}$ of the NOC-CLSA is predominantly determined by the input NMOS transistors and the offset caused by the input NMOS transistors is canceled out. Therefore, $\sigma_{SA\_OS}$ of the NOC-CLSA can be very small.

Figure 9:
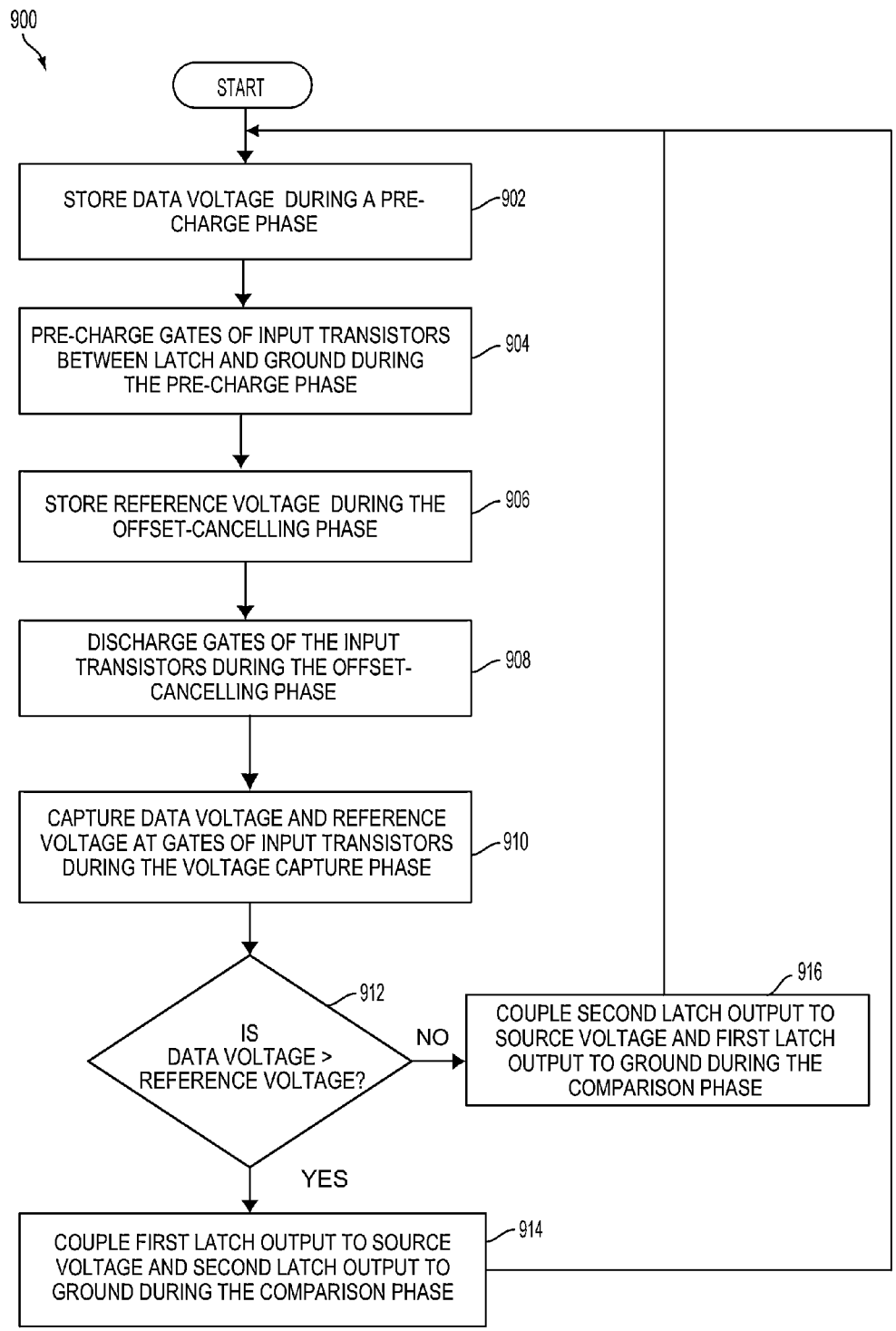
FIG. 9 is process flow diagram illustrating a resistive memory sensing method according to an aspect of the present disclosure.

FIG. 9 is a process flow diagram illustrating a sensing method in a sense amplifier circuit according to an aspect of the present disclosure. The method 900 includes storing a data voltage from a resistive memory sensing circuit in a first isolated capacitor during a first step of a sensing operation (e.g., during pre-charge phase, P1) by a sense amplifier circuit at block 902. The method 900 also includes pre-charging a gate of a first input transistor and a gate of a second input transistor to a source voltage node during the first step of the sensing operation at block 904. The first input transistor is coupled between a first latch transistor of a latch circuit and a ground node. The second input transistor is coupled between a second latch transistor of the latch circuit and the ground node.

The method 900 also includes storing a reference voltage from the resistive memory sensing circuit in a second isolated capacitor during a second step of the sensing operation after the first step (e.g., during offset-cancelling phase, P2) at block 906. The method 900 further includes discharging the gate of the first input transistor and the gate of the second input transistor during the second step of the sensing operation at block 908.

At block 910, the method 900 includes capturing the data voltage at the gate of the first input transistor and capturing the reference voltage at the gate of the second input transistor during a third step of the sensing operation after the second step (e.g., during voltage capture phase).

During a fourth step of the sensing operation after the third step (e.g., during the comparison phase), at block 912 when the data voltage at the gate of the first input transistor is greater than the reference voltage at the gate of the second input transistor the method 900 includes coupling a first output node of the latch circuit to the source voltage node and coupling a second output node of the latch circuit to the ground node at block 914. When the data voltage at the gate of the first input transistor is less than the reference voltage at the gate of the second input transistor, the method 900 includes coupling the first output node of the latch circuit to the ground node and coupling the second output node of the latch circuit to the source voltage node at block 916.

A sensing apparatus according to another aspect of the present disclosure includes means for pre-charging a gate of a first input transistor and a gate of a second input transistor to a first fixed voltage (e.g. VDD). The first input transistor may be coupled between a first latch transistor of a latch circuit and a second fixed voltage node (e.g. GND), and the second input transistor may be coupled between a second latch transistor of the latch circuit and the second fixed voltage node (e.g. GND). The sensing apparatus also includes means for discharging the gate of the first input transistor and the gate of the second input transistor. The means for pre-charging and discharging the gate of the first input transistor and the gate of the second input transistor may include transistors or pass gates coupled between the first fixed voltage and the input NMOS transistors 604, 605 that are turned on during the precharge phase of operation (P1), as shown in FIGS. 6B and 6C, for example.

Aspects of the present disclosure also include means for capturing a data voltage at the gate of the first input transistor and means for capturing a reference voltage at the gate of the second input transistor. The means of capturing a data voltage may include transistors or pass-gates that are turned on during the pre-charge phase of operation (P1), coupled between an output 608 from the offset-cancelling dual stage sensing circuit OCDS-SC and the first isolated capacitor 610. The means of capturing a data voltage may also include transistors or pass-gates coupled between the first isolated capacitor 610 and the gate of the first one of the input NMOS transistors 604, that are turned on during the voltage capture phase of operation (P3) as shown in FIG. 6B, for example. The means of capturing a reference voltage may include transistors or pass-gates that are turned on during the offset cancelling phase of operation (P2), coupled between an output 608 from the offset-cancelling dual stage sensing circuit OCDS-SC and the second isolated capacitor 614. The means of capturing a reference voltage may also include transistors or pass-gates coupled between the second isolated capacitor 614 and the gate of the second one of the input NMOS transistors 606, that are turned on during the voltage capture phase of operation (P3) as shown in FIG. 6C, for example.

According to an aspect of the present disclosure, the sensing apparatus also includes means for coupling a first output node of the latch circuit to the first fixed voltage node and means coupling a second output node of the latch circuit to the second fixed voltage node when the data voltage is greater than the reference voltage. The sensing apparatus also includes means for coupling the first output node of the latch circuit to the second fixed voltage node and means for coupling the second output node to the first fixed voltage node when the reference voltage is greater than the data voltage. According to this aspect of the disclosure, the means for coupling the output nodes of the latch circuit to the first fixed voltage node and the second fixed voltage node may include a transistor or pass-gate that is turned on during the comparison phase of operation (P4) coupled between the first fixed voltage node (e.g. VDD) and the latch circuitry as shown in FIG. 6E the means for coupling the output nodes of the latch circuit to the first fixed voltage node and the second fixed voltage node may include a transistors or pass-gate that is turned on during the comparison phase of operation (P4) coupled between the second fixed voltage node (e.g. GND) and the latch circuitry shown in FIG. 6E, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 10:
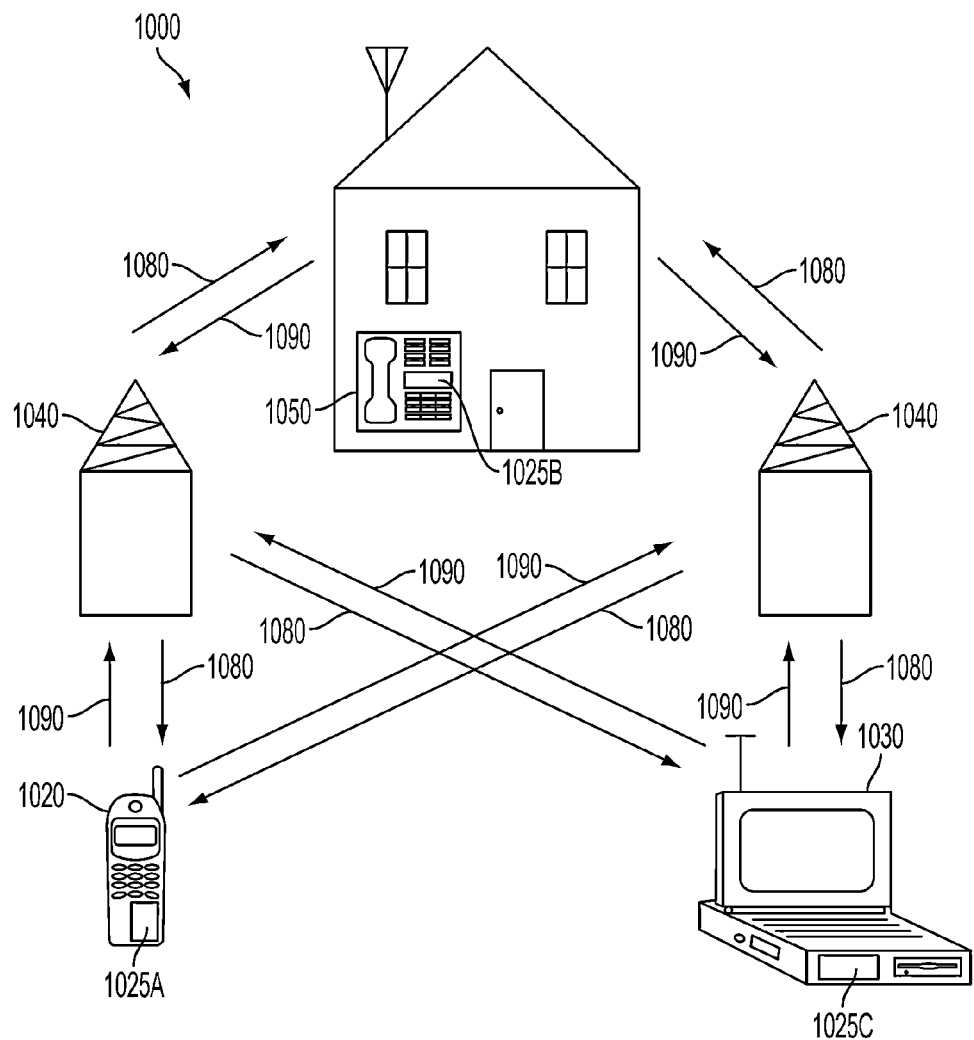
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C and 1025B that include the disclosed offset-cancelling dual stage sensing apparatus. It will be recognized that other devices may also include the disclosed offset-cancelling dual stage sensing apparatus, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 10 illustrates remote units according to the teachings of the disclosure, the disclosure is not limited to these exemplary illustrated units. Aspects of the disclosure may be suitably employed in many devices which include the disclosed offset-cancelling dual stage sensing apparatus.

Figure 11:
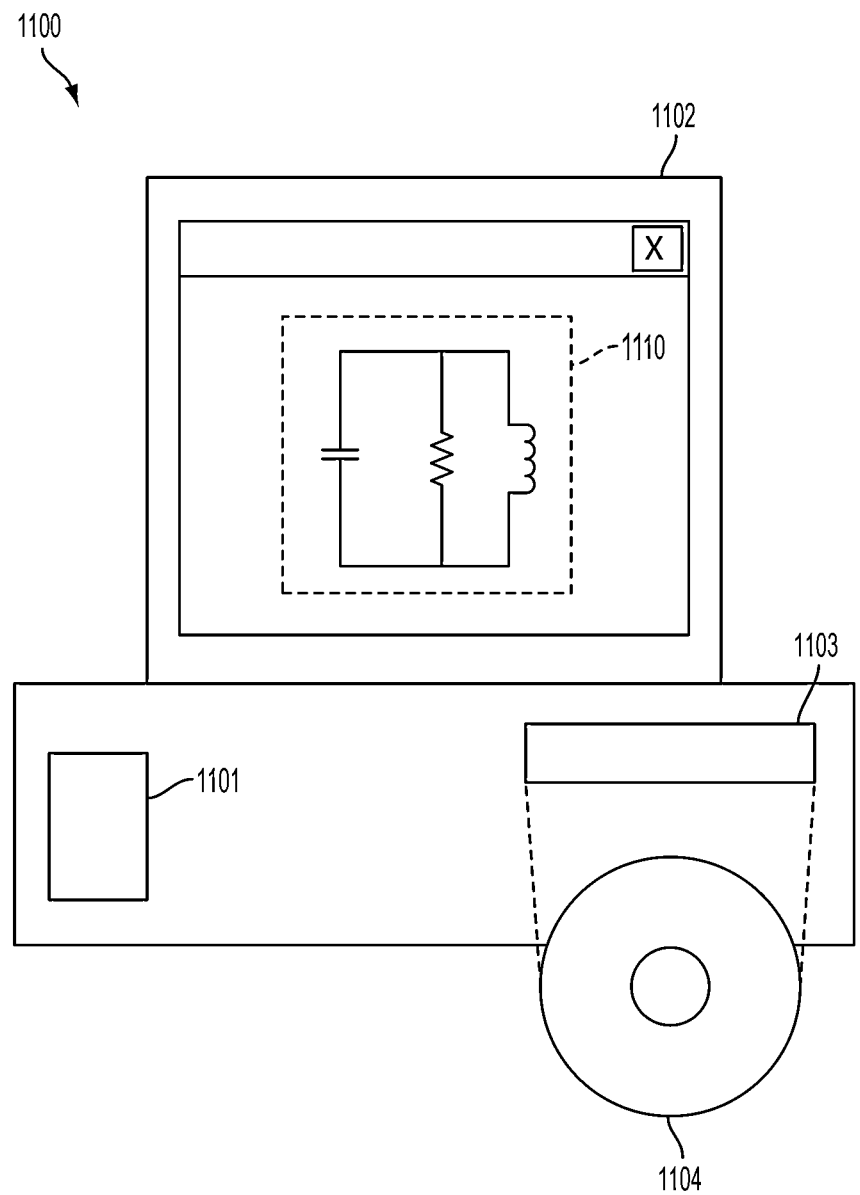
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the offset-cancelling dual stage sensing apparatus disclosed above. A design workstation 1100 includes a hard disk 1101 containing operating system software, support files, and design software such as Cadence or OrCAD. The design workstation 1100 also includes a display 1102 to facilitate design of a circuit design 1110 or a semiconductor component 1112 such as an offset-cancelling dual stage sensing apparatus. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, although SRAM and MRAM were described as types of memories, other memory types are also contemplated, such as DRAM, PCRAM, etc. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A sensing method in a sense amplifier circuit, comprising:
   pre-charging a gate of a first input transistor and a gate of a second input transistor to a first fixed voltage node, the first input transistor coupled between a first latch transistor of a latch circuit and a second fixed voltage node, the second input transistor coupled between a second latch transistor of the latch circuit and the second fixed voltage node;
   discharging the gate of the first input transistor and the gate of the second input transistor;
   capturing a data voltage at the gate of the first input transistor;
   capturing a reference voltage at the gate of the second input transistor;
   coupling a first output node of the latch circuit to the first fixed voltage node and coupling a second output node of the latch circuit to the second fixed voltage node when the data voltage is greater than the reference voltage; and
   coupling the first output node of the latch circuit to the second fixed voltage node and coupling the second output node to the first fixed voltage node when the reference voltage is greater than the data voltage.

2. The sensing method of claim 1, in which the first fixed voltage node comprises a source voltage node and the second fixed voltage node comprises a ground node.

3. The sensing method of claim 1, in which the first input transistor comprises a first NMOS input transistor and the second input transistor comprises a second NMOS input transistor.

4. The method of claim 1, in which the data voltage captured at the gate of the first input transistor is a first phase output of a dual phase offset-cancelling sensing circuit, and the reference voltage captured at the gate of the second input transistor is a second phase output of the dual phase offset-cancelling sensing circuit.

5. The sensing method of claim 1 further comprising integrating the sense amplifier circuit into a mobile phone, a set top box, a music player, a video player, an entertainment unit, a navigation device, a computer, a hand-held personal communication systems (PCS) unit, a portable data unit, and/or a fixed location data unit.

6. A sensing method, comprising:
   during a first step of a sensing operation by a sense amplifier circuit, storing a data voltage from a resistive memory sensing circuit in a first isolated capacitor and pre-charging a gate of a first input transistor and a gate of a second input transistor to a source voltage node, the first input transistor coupled between a first latch transistor of a latch circuit and a ground node, the second input transistor coupled between a second latch transistor of the latch circuit and the ground node;
   during a second step of the sensing operation after the first step, storing a reference voltage from the resistive memory sensing circuit in a second isolated capacitor and discharging the gate of the first input transistor and the gate of the second input transistor;

during a third step of the sensing operation after the second step, capturing the data voltage at the gate of the first input transistor and capturing the reference voltage at the gate of the second input transistor;

during a fourth step of the sensing operation after the third step, coupling a first output node of the latch circuit to the source voltage node and coupling a second output node of the latch circuit to the ground node in response to the data voltage at the gate of the first input transistor being greater than the reference voltage at the gate of the second input gate, and during the fourth step of the sensing operation, coupling the first output node of the latch circuit to the ground node and coupling the second output node of the latch circuit to the source voltage node in response to the reference voltage at the gate of the second input transistor being greater than the data voltage at the gate of the first input transistor.

7. The method of claim 6, in which the first input transistor comprises a first NMOS input transistor and the second input transistor comprises a second NMOS input transistor.

8. The method of claim 6, in which the resistive memory sensing circuit comprises an offset-cancelling dual stage sensing circuit, and in which the first step is contemporaneous with a first phase operation of the offset-cancelling dual stage sensing circuit, and in which the second step is contemporaneous with a second phase operation of the offset-cancelling dual stage sensing circuit.

9. The sensing method of claim 8 comprising:
in the first phase operation of the offset-cancelling dual stage sensing circuit, sensing a data value of a resistive memory data cell using a first load PMOS gate voltage generated by a reference value of a resistive memory reference cell; and
in the second phase operation of the offset-cancelling dual stage sensing circuit, sensing the reference value of the resistive memory reference cell using a second load PMOS gate voltage generated by the data value of the resistive memory data cell.

10. The sensing method of claim 6, in which the resistive memory sensing circuit comprises a magnetic tunnel junction (MTJ) sensing circuit.

11. The sensing method of claim 6 further comprising integrating the sense amplifier circuit into a mobile phone, a set top box, a music player, a video player, an entertainment unit, a navigation device, a computer, a hand-held personal communication systems (PCS) unit, a portable data unit, and/or a fixed location data unit.

12. A resistive memory sensing apparatus, comprising:
a first switched input capacitor coupled between an output of a resistive memory sensing circuit and a first fixed voltage node;
a second switched input capacitor coupled between the output of the resistive memory sensing circuit and the first fixed voltage node;
a latch circuit selectively coupled between a second fixed voltage node and the first fixed voltage node;
a first input transistor coupled between the latch circuit and the first fixed voltage node, the first input transistor including a gate coupled to the first switched input capacitor; and
a second input transistor coupled between the latch circuit and the first fixed voltage node, the second input transistor including a gate coupled to the second switched input capacitor.

13. The resistive memory sensing apparatus of claim 12, in which the resistive memory sensing circuit comprises a magnetic tunnel junction (MTJ) sensing circuit.

14. The resistive memory sensing apparatus of claim 12, in which the first fixed voltage node comprises a ground node and the second fixed voltage node comprises a source voltage node.

15. The resistive memory sensing apparatus of claim 12, integrated in a mobile phone, a set top box, a music player, a video player, an entertainment unit, a navigation device, a computer, a hand-held personal communication systems (PCS) unit, a portable data unit, and/or a fixed location data unit.

16. A sensing apparatus, comprising:
means for pre-charging a gate of a first input transistor and a gate of a second input transistor to a first fixed voltage node, the first input transistor coupled between a first latch transistor of a latch circuit and a second fixed voltage node, the second input transistor coupled between a second latch transistor of the latch circuit and the second fixed voltage node;
means for discharging the gate of the first input transistor and the gate of the second input transistor;
means for capturing a data voltage at the gate of the first input transistor;
means for capturing a reference voltage at the gate of the second input transistor;
means for coupling a first output node of the latch circuit to the first fixed voltage node and means for coupling a second output node of the latch circuit to the second fixed voltage node when the data voltage is greater than the reference voltage; and
means for coupling the first output node of the latch circuit to the second fixed voltage node and means for coupling the second output node to the first fixed voltage node when the reference voltage is greater than the data voltage.

17. The sensing apparatus of claim 16, in which the first fixed voltage node comprises a source voltage node and the second fixed voltage node comprises a ground node.

18. The sensing apparatus of claim 16, in which the first input transistor comprises a first NMOS input transistor and the second input transistor comprises a second NMOS input transistor.

19. The sensing apparatus of claim 16, in which the data voltage captured at the gate of the first input transistor is a first phase output of a dual phase offset-cancelling sensing circuit, and the reference voltage captured at the gate of the second input transistor is a second phase output of the dual phase offset-cancelling sensing circuit.

20. The sensing apparatus of claim 16 integrated into a mobile phone, a set top box, a music player, a video player, an entertainment unit, a navigation device, a computer, a hand-held personal communication systems (PCS) unit, a portable data unit, and/or a fixed location data unit.

* * * * *